US006972167B2

(12) United States Patent
Aoshima

(10) Patent No.: US 6,972,167 B2
(45) Date of Patent: Dec. 6, 2005

(54) PLANOGRAPHIC PRINTING PLATE

(75) Inventor: Keitaro Aoshima, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 643 days.

(21) Appl. No.: 09/847,411

(22) Filed: May 3, 2001

(65) Prior Publication Data

US 2002/0011165 A1 Jan. 31, 2002

(30) Foreign Application Priority Data

May 17, 2000 (JP) ....................................... 2000-144732

(51) Int. Cl.[7] ................................................ G03F 7/004

(52) U.S. Cl. ................. 430/270.1; 430/302; 101/401.1; 101/456

(58) Field of Search .............................. 430/270.1, 302; 101/401.1, 456

(56) References Cited

U.S. PATENT DOCUMENTS

| | | | | | |
|---|---|---|---|---|---|
| 3,861,921 | A | | 1/1975 | Hoffmann et al. | |
| 4,299,912 | A | * | 11/1981 | Shiba et al. | 430/302 |
| 5,464,724 | A | * | 11/1995 | Akiyama et al. | 430/272 |
| 5,908,731 | A | * | 6/1999 | Leenders et al. | 430/273.1 |
| 5,919,601 | A | * | 7/1999 | Nguyen et al. | 430/278.1 |
| 5,948,596 | A | * | 9/1999 | Zhong et al. | 430/278.1 |
| 6,004,723 | A | * | 12/1999 | Figov | 430/272.1 |
| 6,017,677 | A | * | 1/2000 | Maemoto et al. | 430/270.1 |
| 6,068,963 | A | * | 5/2000 | Aoshima | 430/270.1 |
| 6,090,524 | A | * | 7/2000 | Deboer et al. | 430/272.1 |
| 6,132,929 | A | * | 10/2000 | Nakamura et al. | 430/270.1 |
| 6,153,352 | A | * | 11/2000 | Oohashi et al. | 430/270.1 |
| 6,177,230 | B1 | * | 1/2001 | Kawamura | 430/270.1 |
| 6,190,825 | B1 | * | 2/2001 | Denzinger et al. | 430/192 |
| 6,190,831 | B1 | * | 2/2001 | Leon et al. | 430/270.1 |
| 6,238,839 | B1 | * | 5/2001 | Tomita et al. | 430/278.1 |
| 6,245,486 | B1 | * | 6/2001 | Teng | 430/303 |
| 6,248,503 | B1 | * | 6/2001 | Vermeersch et al. | 430/302 |
| 6,261,740 | B1 | * | 7/2001 | Nguyen et al. | 430/271.1 |
| 6,294,311 | B1 | * | 9/2001 | Shimazu et al. | 430/271.1 |
| 6,346,365 | B1 | * | 2/2002 | Kawauchi et al. | 430/302 |
| 6,352,811 | B1 | * | 3/2002 | Patel et al. | 430/270.1 |
| 6,358,669 | B1 | * | 3/2002 | Savariar-Hauck et al. | 430/273.1 |
| 6,423,462 | B1 | * | 7/2002 | Kunita et al. | 430/156 |
| 6,440,633 | B1 | * | 8/2002 | Kawauchi | 430/270.1 |
| 6,468,717 | B2 | * | 10/2002 | Kita et al. | |
| 2002/0015911 | A1 | * | 2/2002 | Nakamura | 430/270.1 |
| 2002/0028404 | A1 | * | 3/2002 | Nakamura et al. | 430/270.1 |
| 2002/0039702 | A1 | * | 4/2002 | Hotta | 430/273.1 |
| 2002/0048722 | A1 | * | 4/2002 | Aoshima | 430/270.1 |
| 2002/0160299 | A1 | * | 10/2002 | Awasa et al. | 430/270.1 |

FOREIGN PATENT DOCUMENTS

| | | | | |
|---|---|---|---|---|
| EP | 1 031 414 | | 8/2000 | |
| EP | 1072402 | * | 1/2001 | B41C/1/10 |
| GB | 1 274 017 | | 5/1972 | |
| JP | 3-281390 | | 12/1991 | |
| WO | WO 96/34316 | | 10/1996 | |
| WO | WO 97/00777 | | 1/1997 | |

* cited by examiner

*Primary Examiner*—Amanda Walke
(74) *Attorney, Agent, or Firm*—Burns, Doane, Swecker & Mathis, L.L.P.

(57) ABSTRACT

A negative type planographic printing plate in which recording can be performed directly from digital data of a computer or the like using an infrared laser. Sensitivity of the plate is high, ablation by a recording layer during recording is suppressed, a developing property is good, occurrence of a film residue does not occur, and image forming properties such as halftone dot reproducibility are excellent. The negative type planographic printing plate has on a supporting body, in the following order, a first layer that contains a polymer insoluble in water and soluble in an alkaline aqueous solution, and a second layer that contains a crosslinking or polymeric compound, which forms a covalent bond by action of light or heat and lowers solubility of the second layer in an alkaline developing liquid.

42 Claims, No Drawings

PLANOGRAPHIC PRINTING PLATE

BACKGROUND OF THE INVENTION

1. Field of the Invention

The present invention relates to a planographic printing plate having susceptibility in an infrared wavelength region and a platemaking method thereof, and particularly relates to a negative-type planographic printing plate which is capable of performing what is called direct lithography, and which is capable of performing a direct lithographic process using an infrared laser from a digital signal of a computer or the like.

2. Description of the Related Art

As the development of laser technologies has been significant in recent years, particularly, a solid state laser and a semiconductor laser emitting an infrared ray in the range from 760 nm–1,200 nm (hereinafter, in some cases, may be referred to as "infrared laser"), which are laser devices with higher output power and miniature size, have been easily commercially available. These infrared lasers are very useful as a recording light source when platemaking is performed by photoengraving directly from digital data of a computer or the like. Therefore, in recent years, demand for an image recording material having a higher susceptibility to such an infrared ray, namely, an image recording material whose solubility in a developing liquid is greatly changed by an infrared ray irradiation has been increased.

As a negative-type image recording material which enables a recording by the above-described infrared laser, a recording material containing an infrared ray absorber, an acid generating agent, a resol resin and a novolak resin has been mentioned in U.S. Pat. No. 5,340,699. However, such a negative-type image recording material requires a heat treatment after laser exposure in order to form an image, therefore, a negative-type image recording material which does not need a heat treatment after an exposure has been desired.

Moreover, in a method of employing a high power density exposure using a highly powered infrared laser, a large amount of optical energy concentrates and a laser ray irradiates into an exposure region during an instant exposure time period, and the optical energy is efficiently converted into thermal energy. By this heat, thermal changes such as chemical change, phase change, changes of forms and structures and the like are made to occur, and these changes are utilized for recording an image. However, in a recording layer of a conventional planographic printing plate, if an adding amount of an infrared absorbing agent is increased in order to enhance the recording sensibility, the laser exposure device and light source may be possibly polluted by ablation (scattering) of the recording layer.

In order to achieve these two objects of enhancing an image formation property and suppressing ablation, an image forming material having a structure in which two recording layers having different respective functions are laminated has been mentioned in Japanese Patent Application Laid-Open No. 11-192782. However, this is a positive type image recording material and it is different from the present invention.

As a negative-type image forming material, for example, a negative-type image forming material having a photosensitive layer in a two-layers structure has been mentioned in WO 97/00777, however, in this configuration, there is a problem that ablation easily occurs because the surface layer which is an exposure surface has photosensitivity, and further, a postexposure is also essential in order to obtain a firm and stable image.

SUMMARY OF THE INVENTION

An object of the present invention is to provide a negative-type planographic printing plate which is capable of directly performing platemaking by recording from digital data of a computer or the like using a solid laser or a semiconductor laser emitting an infrared ray, which is highly sensitive to an infrared laser and in which ablation by a recording layer during recording is suppressed, in which development property is very good and a film residue is not caused, and image forming properties such as halftone dot reproducibility are excellent.

The present inventors have paid their attention to and earnestly considered a layer configuration of a negative-type planographic printing plate which is capable of directly performing platemaking by irradiating with an infrared ray and a property of a surface layer. As a result, it has been found that the above-described problem is capable of being solved by providing a recording layer whose solubility in an alkaline developing liquid is lowered by forming a covalent bond by exposure of an infrared laser, which has a sensitivity to laser exposure and which is provided on the surface of a planographic printing plate. Thus, the present invention has been completed.

Specifically, a planographic printing plate of the present invention contains in turn on a supporting body a first layer containing a polymer which is insoluble in water and soluble in an alkaline aqueous solution and a second layer containing a cross-linking compound or polymeric compound and whose solubility in an alkaline developing liquid is lowered by forming a covalent bond due to optical or thermal action.

Now, it is preferable that the second layer contributing to the image forming property by an exposure contains an infrared absorbing agent, under the condition of not causing ablation.

Moreover, in the viewpoint of effect, it is preferable that a formation reaction of a covalent bond due to optical or thermal action is a cross-linking reaction.

It should be noted that in the present invention, a polymer that is insoluble in water and soluble in an alkaline aqueous solution is referred to simply as "a polymer soluble in an alkaline aqueous solution" as appropriate. Moreover, suppose that the notation "by optical or thermal action" includes the notation "by both optical and thermal actions".

Although actions of the present invention are not clear, the first layer, containing a polymer between the supporting body and the relevant infrared ray susceptible layer, exists and functions as a thermal insulating layer, whereby heat generated by exposure of an infrared laser is not diffused into the supporting body, but efficiently used for a covalent bond formation reaction of the second layer. High sensitivity is realized as well as the sensitivity to an infrared laser by providing the second layer which is an infrared ray susceptible layer and whose solubility in an alkaline developing liquid is lowered by exposure on the exposure surface or the vicinity thereof. Moreover, in the present invention, in an exposure portion, an image excellent in discrimination is formed, and development stability is good since the second layer, having non-permeability to the alkaline developing liquid, functions as a protective layer for the first layer, and stability in an elapsed time is also considered to be secure. Moreover, in a non-exposure portion, an unhardened binder component is quickly dissolved in a developing liquid and dispersed, and further, since the first layer existing adjacent to the supporting body contains a polymer soluble in an alkaline aqueous solution, solubility in a developing liquid is good, for example, even in the case where the developing liquid or the like whose activity has been lowered is employed, the first layer is quickly dissolved without the occurrence of film residue and the like, which is considered as an excellent development property.

DESCRIPTION OF THE PREFERRED EMBODIMENTS

Hereinafter, a planographic printing plate of the present invention contains a first layer containing a polymer insoluble in water and soluble in an alkaline aqueous solution (hereinafter, referred to as a polymer layer soluble in an alkaline aqueous solution or simply as a polymer layer, as appropriate) and a second layer containing a cross-linking compound or a polymeric compound, forming a covalent bond by optical or thermal action and whose solubility in an alkaline developing liquid is lowered (hereinafter, referred to as an infrared susceptible layer as appropriate) are in turn provided. It is preferable if these layers are provided in this order, and further, it will also be good if known layers such as a surface layer, an intermediate layer, a back coated layer and the like are provided, as long as the effects of the present invention are not impaired.

[The first layer containing a polymer insoluble in water and soluble in an alkaline aqueous solution (polymer soluble in an alkaline aqueous solution)]

A polymer layer soluble in an alkaline aqueous solution of the present invention contains a polymer insoluble in water and soluble in an alkaline aqueous solution as a main component. Since this polymer is excellent in coating film formation , it can form a layer unaided.

The term "a polymer soluble in an alkaline aqueous solution" in the present invention involves single polymers containing an acidic group in a main chain and/or in a side chain in a polymer, copolymers containing these, and mixtures of these. Therefore, a polymer of the present invention has a soluble property when it contacts with an alkaline developing liquid.

Among these, a polymer having an acidic group listed in the following (1)–(6) in a main chain and/or in a side chain of the polymer is preferable in the viewpoint of solubility in an alkaline developing liquid.

(1) Phenolic hydroxyl group (—Ar—OH)

(2) Sulfonamide group ($—SO_2NH—R$)

(3) Substituted sulfonamide based acidic group (hereinafter, referred to as "active imide group") [$—SO_2NHCOR$, $—SO_2NHSO_2$, $—CONHSO_2R$]

(4) Carboxylic acid group ($—CO_2H$)

(5) Sulfonic acid group ($—SO_3H$)

(6) Phosphate group ($—OPO_3H_2$)

Among the above-described (1)–(6), Ar represents a bivalent aryl linkage group which may have a substituent, and R represents a hydrocarbon group which may have a substituent.

Among polymers soluble in an alkaline aqueous solution having an acidic group selected from the above-described (1)–(6), a polymer soluble in an alkaline aqueous solution having (1) phenol group, (2) sulfonamide group or (3) active imide group is preferable, particularly, a polymer soluble in an alkaline aqueous solution having (1) phenol group or (2) sulfonamide group is most preferable from the viewpoint of sufficiently securing solubility and film strength in an alkaline developing liquid.

As a polymer soluble in an alkaline aqueous solution having an acidic group selected from the above-described (1)–(6), for example, the following can be listed.

(1) As polymers soluble in an alkaline aqueous solution having a phenol group, a novolak resin and polymers having a hydroxyaryl group and the like in a side chain are listed. As a novolak resin, resins in which phenols and aldehydes are fused under acidic conditions are listed.

Among these, for example, a novolak resin obtained from phenol and formaldehyde, a novolak resin obtained from m-cresol n and formaldehyde, a novolak resin obtained from p-cresol and formaldehyde, a novolak resin obtained from o-cresol and formaldehyde, a novolak resin obtained from octylphenol and formaldehyde, a novolak resin obtained from an m-/p-cresol mixture and formaldehyde, a novolak resin obtained from a phenol/cresol (any one of m-, p-, o- or m-/p-, m-/o-, o-/p-mixture) mixture and formaldehyde, and the like are preferable.

As for a novolak resin, a weight average molecular weight i n the range of 800–200,000 is preferable, and a number average molecular weight in the range of 400–60,000 is preferable.

Moreover, a polymer having a hydroxyaryl group in a side chain is also preferable. As a hydroxyaryl group in the relevant polymer, an aryl group to which more than one OH groups are coupled is listed.

As an aryl group, for example, a phenyl group, a naphtyl group, an anthracenyl group, a phenanthrenyl group and the like are listed; among them, from the viewpoint of availability and material property, a phenyl group or a naphtyl group is preferable.

Therefore, as a hydroxyaryl group, a hydroxyphenyl group, a dihydroxyphenyl group, a trihydroxyphenyl group, a tetrahydroxyphenyl group, a hydroxynaphthyl group, a dihydroxynaphthyl group and the like are preferable.

It is preferable if these hydroxyaryl groups have further a halogen atom, a substituent such as a hydrocarbon having a carbon atom number of 20 or less, an alkoxy group having a carbon atom number of 20 or less, an aryloxy group having a carbon atom number of 20 or less and the like.

It is preferable if a hydroxyaryl group couples to a main chain constituting a polymer as a side chain in a pendant shape, however, there may be a connecting group between the main chain and the group.

As a polymer preferable in the present embodiment and having a hydroxyaryl group in a side chain, for example, a polymer containing any one of constitutional units represented by the following general formulae (IX)–(XII) can be listed. However, the present invention is not limited to these.

(IX)

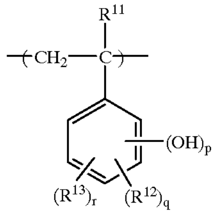

-continued (X)

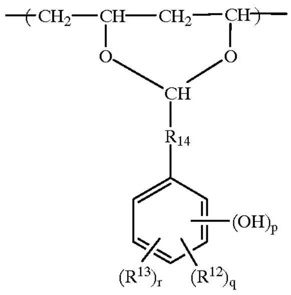

(XI)

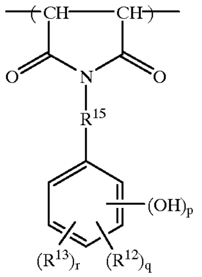

(XII)

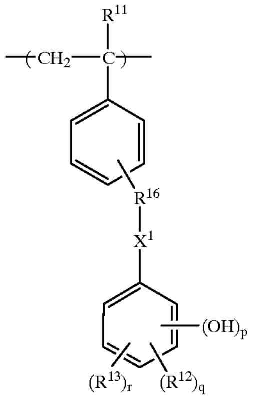

In the above formulae (IX)–(XII), $R^{11}$ represents hydrogen atom or methyl group. $R^{12}$ and $R^{13}$ may be identical or different, and represent a hydrogen atom, a halogen atom, hydrocarbon group having a carbon atom number of 10 or less, an alkoxy group having a carbon atom number of 10 or less, or aryloxy group having a carbon atom number of 10 or less. Moreover, $R^{12}$ and $R^{13}$ may form a benzene ring or cyclohexane ring by bonding each other or condensing a ring. $R^{14}$ represents single bond or bivalent hydrocarbon group having a carbon atom number of 20 or less. $R^{15}$ represents single bond or bivalent hydrocarbon group having a carbon atom number of 20 or less. $R^{16}$ represents single bond or bivalent hydrocarbon group having a carbon atom number of 10 or less. $X^1$ represents single bond, ether bond, thioether bond, ester bond or amide bond. p represents an integer of 1–4. q and r represent an integer of 0–3 respectively and independently.

Hereinafter, although specific examples of constitutional units represented by the foregoing general formulae (IX)–(XII) are listed, the present invention is not limited to these.

(IX-1)

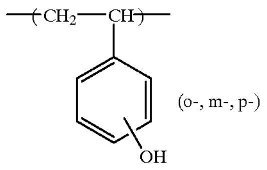

(IX-2)

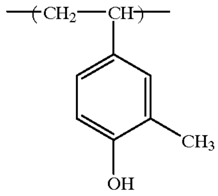

(IX-3)

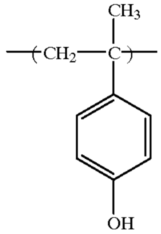

(IX-4)

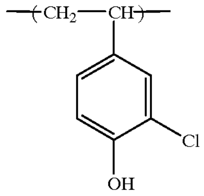

(X-1)

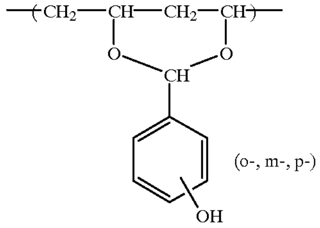

(X-2)

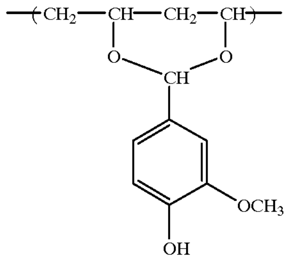

(X-3)

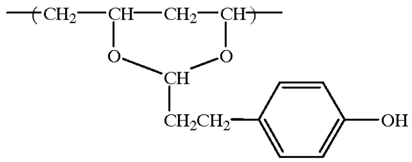

-continued
(X-4)
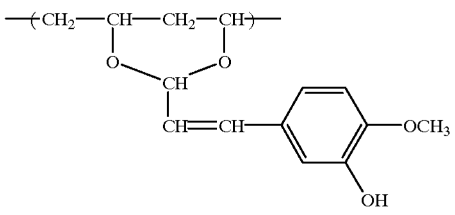
(X-5)
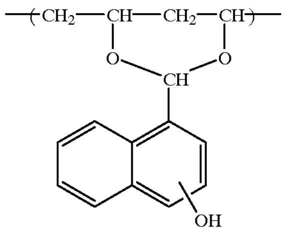
(XI-1)
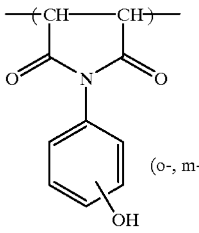
(o-, m-, p-)
(XI-2)
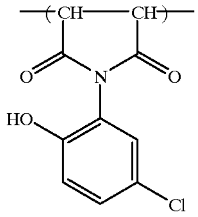
(XI-3)
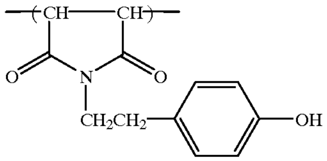
(XI-4)
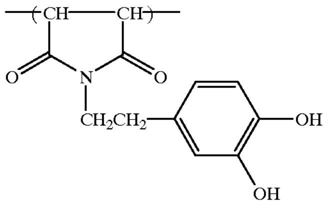
(XI-5)
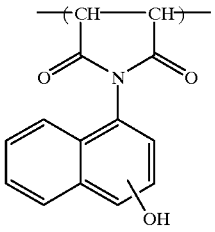
-continued
(XII-1)
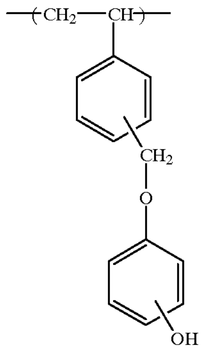
(XII-2)
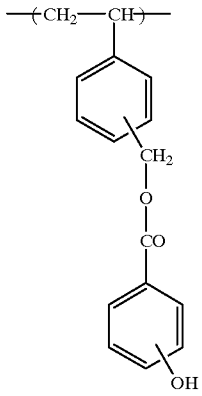
(XII-3)
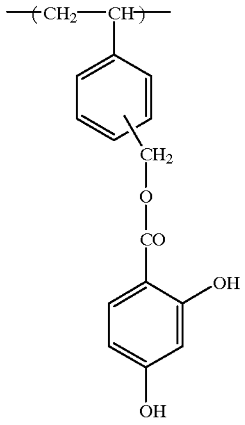
(XII-4)
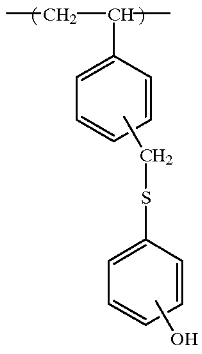

-continued (XII-5)

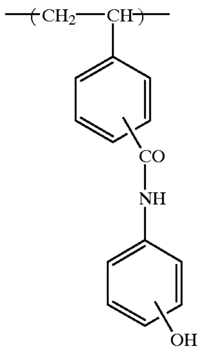

(XII-6)

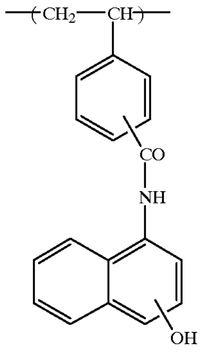

A polymer containing the foregoing constitutional units can be synthesized by selecting from conventional known methods as appropriate.

A polymer having a constitutional unit represented by the general formula (IX) can be obtained, for example, by performing a radical polymerization or anionic polymerization of a corresponding styrene derivative in which a hydroxy group is protected as an acetate or t-butylether into a polymer, and subsequently, by performing a deprotection.

A polymer having a constitutional unit represented by the general formula (X) can be synthesized, for example, by the methods which have been described in JP-A No. 64-32256 and JP-A No. 64-35436.

A polymer having a constitutional unit represented by the general formula (XI) can be obtained by obtaining a corresponding monomer through making an amine compound having a hydroxy group and maleic anhydride react, and subsequently by performing a radical polymerization.

A polymer having a constitutional unit represented by the general formula (XII) can be obtained, for example, by deriving styrenes having a functional group useful for synthesis such as chlormethylstyrene and carboxy styrene and the like as raw materials to a monomer corresponding to the general formula (XII), and further, by performing a radical polymerization.

In the present embodiment of the present invention, it is preferable if a polymer is a homopolymer which contains only constitutional units represented by general formulae (IX) to (XII) or a copolymer which contains other constitutional units.

As the foregoing other constitutional units, for example, constitutional units from known monomers such as acrylic esters, methacrylic esters, acrylamides, methacrylamides, vinylesters, styrenes, acrylates, methacrylates, acrylonitriles, maleic anhydrides, maleimides and the like are listed.

As the foregoing acrylic esters, for example, methyl acrylate, ethyl acrylate, (n- or i-) propyl acrylate, (n-, i-, sec- or t-) butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl) ethyl acrylate, furfuryl acrylate, tetrahydrofurfuryl acrylate, phenyl acrylate, chlorophenyl acrylate, sulfamoylphenyl acrylate and the like are listed.

As the foregoing methacrylic esters, for example, methyl methacrylate, ethyl methacrylate, (n- or i-) propyl methacrylate, (n-, i-, sec- or t-) butyl methacrylate, amyl methacrylate, 2-ethylhexylmethacrylate, dodecylmethacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl) ethyl methacrylate, furfuryl methacrylate, tetrahydrofurfuryl methacrylate, phenyl methacrylate, chlorophenyl methacrylate, sulfamoylphenyl methacrylate and the like are listed.

As the foregoing acrylamides, for example, acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl) acrylamide, N-(sulfamoylphenyl) acrylamide, N-(phenylsulfonyl) acrylamide, N-(tolylsulfonyl)acrylamide, N,N-dimethylacrylamide, N-methyl-N-phenylacrylamide, N-hydroxyethyl-N-methylacrylamide and the like are listed.

As the foregoing methacrylamides, for example, methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylemethacrylamide, N-(p-hydroxyphenyl) methacrylamide, N-(sulfamoylphenyl) methacrylamide, N-(phenylsulfonyl) methacrylamide, N-(tolylsulfonyl) methacrylamide, N,N-dimethylmethacrylamide, N-methyl-N-phenylmethacrylamide, N-hydroxyethyl-N-methylmethacrylamide and the like are listed.

As the foregoing vinyl esters, for example, vinyl acetate, vinyl butylate, vinyl benzoate and the like are listed.

As the foregoing styrenes, for example, styrene, methyl styrene, dimethyl styrene, trimethyl styrene, ethyl styrene, propyl styrene, cyclohexyl styrene, chloromethyl styrene, trifluoromethyl styrene, ethoxymethyl styrene, acetoxymethyl styrene, methoxy styrene, dimethoxymethyl styrene, chlorostyrene, dichlorostyrene, bromostyrene, iodestyrene, fluorostyrene, carboxystyrene and the like are listed.

Among these monomers, acrylic esters, methacrylic esters, acrylamides, methacrylamides, vinyl esters, styrenes, acrylates, methacrylates, acrylonitriles having a carbon atom number of 20 or less, respectively, are preferable.

As the ratio of a constitutional unit represented by the general formulae (IX)–(XII), contained in a copolymer employing the above-described monomers, 5–100% by weight is preferable, and 10–100% by weight is more preferable.

As a molecular weight of the polymer having a hydroxyaryl group in the side chain, 4,000 or more in weight average molecular weight is preferable, 10,000–300,000 in weight average molecular weight is more preferable. 1000 or more is preferable, 250,000 is more preferable in number average molecular weight. Furthermore, as a polydispersity (weight average molecular weight/number average molecular weight) 1 or more is preferable, and 1.1–10 is more preferable.

A polymer having a hydroxyaryl group in the side chain is preferable if it is anyone of a randompolymer, block polymer, graft polymer and the like. However, a random polymer is preferable among these.

(2) As a polymer soluble in an alkaline aqueous solution, which has a sulfonamide group, for example, a polymer formed of a minimal constitutional unit from a compound having a sulfonamide group as a major constitutional component is capable of being listed. As the above-described compound, compounds having one or more of a sulfonamide group in which at least one hydrogen atom is bonded to nitrogen atom and a polymerizable unsaturated group, respectively, within the molecules are listed. Among them, a small molecular compound having acryloyl group, aryl group, or vinyloxy group and substituted or mono-substituted aminosulfonyl group or sulfonylimino group within its molecules is preferable, for example, compounds represented by the following general formula 1 to the general formula 5 are listed.

General formula 1

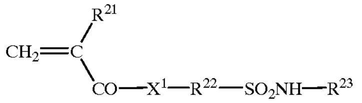

General formula 2

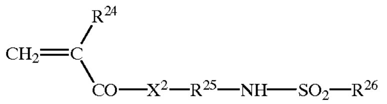

General formula 3

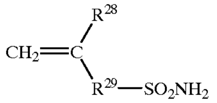

General formula 4

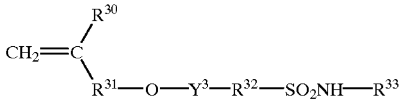

General formula 5

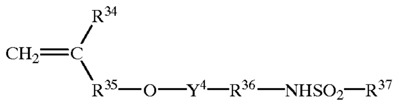

[In the formulae, $X^1$ and $x^2$ represent —O— or $—NR^{27}—$, respectively and independently. $R^{21}$ and $R^{24}$ represent a hydrogen atom, or $—CH_3$, respectively and independently. $R^{22}$, $R^{25}$, $R^{29}$, $R^{32}$ and $R^{36}$ represent alkylene group, cycloalkylene group, arylene group or aralkyl group which have carbon number of 1–12 and may have a substituent, respectively and independently. $R^{23}$, $R^{27}$ and $R^{33}$ represent alkyl group, cycloalkyl group, aryl group or aralkyl group which have carbon number of 1–12 and may have a substituent, respectively and independently. Moreover, $R^{26}$ and $R^{37}$ represent alkyl group, cycloalkyl group, aryl group and aralkyl group which have carbon number of 1–12 and may have a substituent, respectively and independently. $R^{28}$, $R^{30}$ and $R^{34}$ represent a hydrogen atom or $—CH_3$, respectively and independently. $R^{31}$ and $R^{35}$ represent alkylene group, cycloalkylene group, arylene group and aralkylene group which have carbon number of 1–12, may have a single bond or may have a substituent, respectively and independently. $Y^3$ and $Y^4$ represent a single bond or —Co—, respectively and independently.]

Out of compounds represented by the general formula 1 to the general formula 5, in a negative-type planographic printing plate of the present invention, particularly, m-aminosulfonylphenylmethacrylate, N-(p-aminosulfonylphenyl) metharylamide, N-(p-aminosulfonylphenyl) acrylamide and the like are capable of being preferably used.

(3) As a polymer soluble in an alkaline aqueous solution having an active imide group, for example, a polymer containing minimum constitutional units from a compound having an active imide group as a major constitutional component is capable of being listed. As a compound as described above, a compound in which one or more of an active imide group represented by the following structural formula and a polymerizable unsaturated group, respectively, are contained within the molecules is capable of being listed.

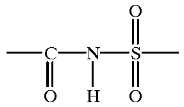

Specifically, N-(p-toluenesulfonyl) metharylamide, N-(p-toluenesulfonyl) acrylamide and the like are capable of being preferably used.

(4) As a polymer soluble in an alkaline aqueous solution having a carboxylic acid group, for example, a polymer containing a minimum constitutional unit from a compound having one or more of a carboxylic acid group and a polymerizable unsaturated group, respectively, within the molecules as a major constitutional component is capable of being listed.

(5) As a polymer soluble in an alkaline aqueous solution having a sulfonic acid group, for example, a polymer containing a minimum constitutional unit from the compound having one or more of a sulfonic acid group and a polymerizable unsaturated group, respectively as the major constitutional unit within the molecules is capable of being listed.

(6) As a polymer soluble in an alkaline aqueous solution having a phosphate group, for example, a polymer containing a minimum constitutional unit from a compound having one or more of a phosphate group and a polymerizable unsaturated group, respectively within the molecules as a major constitutional component is capable of being listed.

The minimum constitutional unit having an acidic group selected from the foregoing (1)–(6), which forms a polymer soluble in an alkaline aqueous solution employed for a negative-type planographic printing plate material of the present invention is not necessarily particularly only one kind; a compound in which two kinds or more of the minimum constitutional units having the same acidic group are co-polymerized, or a compound in which two kinds or more of the minimum constitutional unit having different acidic groups are co-polymerized are also capable of being used.

As a method of copolymerization, a conventionally known graft copolymerization method, ablock copolymerization method, a random copolymerization method and the like are capable of being used.

As the foregoing copolymer, a copolymer in which a compound having an acidic group selected from (1)–(6) to be co-polymerized is contained in 10 mole % or more in the copolymer is preferable, and a polymer in which a compound having an acidic group selected from (1)–(6) to be co-polymerized is contained in 20 mole % or more in the copolymer is more preferable. In the case of less than 10 mole %, there is a tendency of development latitude being not sufficiently enhanced.

In the present invention, in the case where compounds are co-polymerized in order to form a copolymer, as their compounds, other compounds not containing an acidic group of the foregoing (1)–(6) are capable of being employed. As an example of the other compounds not containing an acidic group of (1)–(6), the compounds listed in the following (m1)–(m11) are capable of being exemplified.

(m 1) Acrylic esters and methacrylic esters having an aliphatic hydroxyl group such as, for example, 2-hydroxyethylacrylate or 2-hydroxyethylmethacrylate and the like, (m 2) Alkylacrylates such as methyl acrylate, ethyl acrylate, propyl acrylate, butyl acrylate, amyl acrylate, hexyl acrylate, octyl acrylate, benzyl acrylate, acrylate-2-chloroethyl, glycidyl acrylate, N-dimethylaminoethyl acrylate and the like, (m 3) Alkylmethacrylates such as methyl methacrylate, ethyl methacrylate, propyl methacrylate, butyl methacrylate, amyl methacrylate, hexyl methacrylate, cyclohexyl methacrylate, benzyl methacrylate, methacrylate-2-chloroethyl, glycidyl methacrylate, N-dimethylaminoethyl methacrylate and the like, (m 4) Acrylamides ormethacrylamides, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N -ethyl-N-phenylacrylamide and the like, (m 5) Vinyl ethers such as ethylvinyl ether, 2-chloroethylvinyl ether, hydroxyethylvinyl ether, propylvinyl ether, butylvinyl ether, octylvinyl ether, phenylvinyl ether, (m 6) Vinyl esters such as vinyl acetate, vinyl chloroacetate, vinylbutylate, vinylbenzoate and the like, (m 7) Styrenes such as sytrene, α-methyl styrene, methyl styrene, chloromethyl styrene and the like, (m 8) Vinyl ketones such as methyl vinyl ketone, ethyl vinyl ketone, propyl vinyl ketone, phenyl vinyl ketone and the like, (m 9) Olefins such as ethylene, propylene, isobutylene, butadiene, isoprene and the like, (m 10) N -vinylpyrrolidone, N-vinylcarbazol, 4-vinylpyridine, acrylonitrile, methacrylonitrile and the like, (m 11) Unsaturated imides such as maleimide, N-acryloylacrylamide, N-acetylmethacrylamide, N-propyonylmethacrylamide, N-(p-chlorobenzoyl) methacrylamide and the like.

As a polymer soluble in an alkaline aqueous solution used for a planographic printing plate of the present invention, a weight average molecular weight of 2,000 or more, a number average molecular weight of 500 or more is preferable from the viewpoint of the sensitivity and the development latitude, independently of the classification of homopolymer or copolymer, and a polymer whose weight average molecular weight is in the range of 5,000–300,000 and number average molecular weight is in the range of 800–250,000 is more preferable. Moreover, a polymer whose polydispersity (weight average molecular weight/number average molecular weight) is in the range of 1.1–10 is preferable.

In the case where a copolymer is used in the present invention, a blending weight ratio of the minimum constitutional unit from the compound having an acidic group selected from the foregoing (1)–(6), constituting its main chain and/or side chain and the other minimum constitutional unit not containing an acidic group of (1)–(6), constituting one portion of the main chain and/or side chain is preferably in the range of 50:50–5:95, and more preferably in the range of 40:60–10:90 from the viewpoint of the effect.

As to the foregoing polymer soluble in an alkaline aqueous solution, one kind thereof may be used alone, or a combination of two or more kinds thereof may be also used.

Although this polymer soluble in an alkaline aqueous solution may occupy 10% of the total solid contents of the materials constituting the polymer layer, since the other components are used in combination with it in order to enhance layer formation property and coating property, it is preferable to employ it in the range of 30–99% by weight, and it is more preferable to employ it in the range of 45–95% by weight.

In the case where the above-described usage of the polymer soluble in an alkaline aqueous solution is less than 30% by weight, it is not preferable because the layer formation property and the coated property of the polymer layer have a tendency of being deteriorated.

As solvents capable of being employed in the synthesis of the polymer soluble in an alkaline aqueous solution used for the present invention, for example, tetrahydrofuran, ethylenedichloride, cyclohexanon, methylethyl ketone, acetone, methanol, ethanol, ethyleneglycolmonomethyl ether, ethyleneglycolmonoethyl ether, 2-methoxyethylacetate, diethyleneglycol dimethyl ether, 1-methoxy-2-propanol, 1-methoxy-2-propylacetate, N,N-dimethylformamide, N,N-dimethylacetamide, toluene, ethyl acetate, methyl lactate, ethyl lactate, dimethyl sufoxide, water and the like are listed. These solvents are capable of being used singly or as two kinds or more in combination.

The polymer layer may further contain an infrared absorbing agent in order to enhance the sensitivity, and the infrared absorbing agent used herein is capable of being used similarly to those infrared absorbing agents described later in detail in the following description of the second layer.

A preferable amount of an infrared absorbing agent contained in a polymer layer is in the order of 0.01–50% by weight of the total solid contents.

A variety of additives besides the above-described materials constituting the polymer of the present invention are capable of being used in combination therewith as necessary.

For example, thermal decomposition compounds such as onium salt, aromatic sulfonate and the like which are described in paragraph number [0067] and thereafter of JP-A No. 11-174681 as “other components” which are capable of being added to the positive type photosensitive composition are preferable to adjust a solubility inhibition property of the image portion, and others, for example, additives useful for sensitivity enhancement such as cyclic acid anhydrides, phenols, organic acids, a surfactant, a print-out agent, and dyes and pigments as an image coloring agent are also capable of being similarly used in the present invention.

Moreover, epoxy compounds, vinyl ether compounds, and further, phenol compounds having a hydroxymethyl group described in JP-A No. 8-276558, and cross linking compounds having an alkaline solubility suppression action described in JP-A No. 11-160860 are capable of being added according to purpose, as appropriate.

The planographic printing plate of the present invention has the second layer, whose solubility in an alkaline developing liquid is lowered by forming a covalent bond by optical or thermal action, and which contains cross-linking or polymeric compounds, on the foregoing polymer layer formed on the supportive body.

[The second layer (infrared ray susceptible layer) whose solubility in an alkaline developing liquid by forming a covalent bond by optical or thermal action, and which contains a cross-linking or polymeric compounds]

It is preferable that an infrared ray susceptible layer is formed on the light exposure surface of the top layer of the planographic printing plate. An infrared absorbing agent generates heat by exposure of an infrared laser. Due to the heat, the covalent bond formation reaction is caused, only an exposure portion of the infrared ray susceptible layer is hardened, and the solubility in an alkaline developing liquid is lowered. Further, a non-permeability property of an alkaline developing liquid to the first layer is revealed, while on a non-exposure portion, since solubility property in an alkaline developing liquid is maintained and the first layer of the lower layer also contains a polymer soluble in an alkaline developing liquid, the non-exposure portion exhibits a high solubility, and a negative-type image having a good picture quality is formed without any film residue.

There are no particular limitations to reactions capable of forming such a covalent bond. As long as the solubility of the infrared ray susceptible layer in the alkaline developing liquid is lowered by the reaction, and the reaction is capable of forming an image having a necessary intensity, the reaction will be good if it is any one of the known radical polymerization reaction, cation polymerization reaction, anion polymerization reaction, condensation polymerization reaction, addition polymerization reaction and the like, and it is also preferable if a reaction in which polymers having polymerizable function groups are bonded to each other by cross-linking and hardened.

As one of representative infrared ray susceptible layers hardened by forming such a covalent bond, a photopolymerization layer is listed. A photopolymerization layer contains (A) an infrared absorbing agent, (B) a radical generating agent (radical polymeric generation agent), (C) a radical polymeric compound in which a polymerization reaction is caused by the generated radical and which is hardened, and preferably contains (D) a binder polymer. An infrared ray absorbed by an infrared absorbing agent is converted into heat. Due to the heat generated at that time, a radical polymerization initiation agent such as onium salt and the like decomposes and a radical is generated. A radical polymeric compound is selected from compounds having at least one ethylene type unsaturated double bond and at least one terminal ethylene type unsaturated bonds, or preferably two or more terminal ethylene type unsaturated bonds. Polymerization reactions are generated in series by the caused radical and the layer is hardened.

Moreover, as an other aspect of an infrared ray susceptible layer, an acid cross-linking layer is listed. An acid cross-linking layer contains (E) a compound generating an acid by light or heat (hereinafter, referred to as acid generation agent), (F) a compound cross-linking by the generated acid (hereinafter, referred to as cross-linking agent), and further, contains (G) an alkaline soluble polymer capable of reacting with the cross-linking agent in the presence of this acid cross-linking layer. In this acid cross-linking layer, acid generated by decomposition with the acid generation agent promotes the work of the cross-linking agent, strong and firm cross-linking structures are formed between the cross-linking agents or between the cross-linking agent and a binder polymer, thereby lowering the alkaline solubility and making the layer insoluble in a developing agent. At this time, in order to efficiently utilize the energy of an infrared laser, it is preferable for the aspect to blend (A) an infrared absorbing agent in the infrared ray susceptible layer.

Each compound used in a recording layer of a negative type planographic printing plate will be described below.

[(A) Infrared Absorbing Agent]

An infrared ray susceptible layer of a planographic printing plate of the present invention has a structure capable of recording an image by a laser emitting an infrared ray. In such an infrared ray susceptible layer, it is preferable to use an infrared absorbing agent. The infrared absorbing agent has a function for converting absorbed infrared into heat. Due to the heat generated at that time, the radical generation agent or acid generation agent is decomposed, and a radical or acid is generated. The infrared absorbing agent used in the present invention is a dye or pigment having the absorption maximum in the range of the wavelengths 760 nm–1,200 nm.

As dyes, commercially available dyes such as the known dyes mentioned in the literatures of "Handbook of Dyes" edited by The Society of Synthetic Organic Chemistry, Japan (Showa 45; 1970) and the like can be utilized. Specifically, for example, a dye described in the description from paragraph[0050] to paragraph[0051] of JP-A No. 10-39509, is capable of being listed.

As the particularly preferable dyes among these dyes, cyanine dye, squarylium dye, pyrylium salt, and nickel thiolate complex are listed. Further, a cyanine pigment is preferred, particularly, the cyanine pigment represented by the following general formula (I) is the most preferable one.

General formula (I)

一般式 (I)

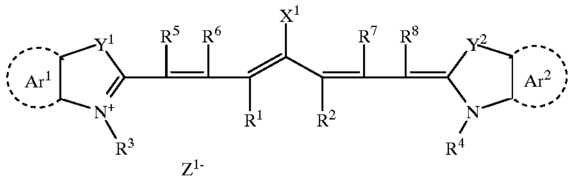

In the general formula (I), $X^1$ represents a halogen atom or $X^2$–$L^1$, wherein $X^2$ represents an oxygen atom or a sulfur atom; $L^1$ represents hydrocarbon group having a carbon atom number of 1–12; $R^1$ and $R^2$ represent a hydrocarbon group having a carbon atom number of 1–12, respectively and individually. In consideration of conservative stability of an infrared ray susceptible layer coating liquid, $R^1$ and $R^2$ are preferably a hydrocarbon group having two or more carbon atoms, and further, it is particularly preferable that $R^1$ and $R^2$ bind each other and forms five-membered ring or six-membered ring.

It is preferable if $Ar^1$ and $Ar^2$ are either identical with or different from each other, respectively, each of them represents aromatic hydrocarbon group which may have a substituent. It is also preferable if $Y^1$ and $Y^2$ are either identical with or different from each other, respectively, and each of them represents a sulfur atom or dialkylmethylene group having a carbon atom number of 12 or less. It is also preferable if $R^3$ and $R^4$ are either identical with or different from each other, respectively, and each of them represents a hydrocarbon group having a carbon atom number of 20 or less which may have a substituent. As the preferred substituents, alkoxy group, carboxylic acid group and sulfo group, having a carbon atom number of 12 or less are listed. It is preferable if $R^5$, $R^6$, $R^7$and $R^8$ are either identical with or different from each other, respectively, and each of them represents a hydrogen atom or a hydrocarbon group having a carbon atom number of 12 or less. In consideration of availability for raw materials, preferably it is a hydrogen atom. Moreover, $Z^{1-}$ represents a counter anion. Provided that sulfo group is replaced with any one of $R^1$–$R^8$, $Z^{1-}$ is not needed. The preferred $Z^{1-}$ are a halogen ion, a perchlorate ion, tetrafluoroborate ion, hexafluorophosphate ion and sulfonate ion, and the particularly preferred are perchlorate ion, hexafluorophosphate ion and arylsulfonate ion.

As a specific example of cyanine dye represented by the general formula (I), which is capable of being preferably used in the present invention, cyanine pigment which is described in the description from paragraph[0017] to paragraph[0019] of the specification of Japanese Patent Application No. 11-310623 is capable of being listed.

As pigments used in the present invention, commercially available pigments and those described in "Handbood of Color Indexes (C.I.)", "Latest pigment Handbook" edited by Japanese Pigment Technologies Association, 1977, "Latest Pigment Application Technologies" CMC Publishing Company, 1986 and "Printing Ink Technologies" CMC Publishing Company, 1984, are capable of being utilized.

As kinds of pigments, a black color pigment, a yellow color pigment, an orange color pigment, a brown color pigment, a red color pigment, a purple color pigment, a blue color pigment, a green color pigment, a fluorescent pigment, a metal powder pigment, and besides these, a polymer bond pigment are listed. The details of these pigments is described in the description from paragraph[0052] to paragraph[0054] in the specification of JP-A No. 10-39509, and these are also capable of being applied to the present invention. The preferred pigment among these pigments is a carbon black.

As contents of the above-described dyes or pigments in the infrared ray susceptible layer, an amount not causing ablation in the infrared ray susceptible layer is preferable. Specifically, If the contents of the infrared absorbing agent in the infrared ray susceptible layer is too large, dramatic heating is caused locally in the light exposure portion of the infrared laser and the possibility that ablation is caused in the entire infrared ray susceptible layer becomes higher. As an amount not generating the ablation, for example, contents on the order of 1.0 or less of the optical density of the infrared ray susceptible layer or contents of 10% by weight or less with respect to the total solid contents weight of the polymer compound in the infrared ray susceptible layer and so forth are listed. As long as the optical density is in the above-described range, even in the case where heating by the infrared laser is generated, although it is considered that the energy is sufficient to initiate and promote the cross-linking and polymerization reaction, there is no concerns about the generation of an explosive ablation.

Moreover, if the contents of the infrared absorbing agent in the infrared ray susceptible layer increases, and the optical density is too high, it is difficult for an infrared laser used in writing to reach out to the deep portion of the infrared ray susceptible layer, and concerns rise that the sensitivity is lowered.

Noted that, even if the optical density of the infrared ray susceptible layer exceeds over 1.0, in the case where the heat capacity of the entire infrared ray susceptible layer is large, the heat is dispersed in the layer, and there is no concerns about generation of the ablation. However, the amount of the infrared absorbing agent should not be necessarily determined by only the optical density. Therefore, when the contents of the infrared absorbing agent is determined in order to enhance the sensitivity, it is preferable that the contents is determined as appropriate while paying attention to these points described above, and in consideration of other components of the infrared ray susceptible layer or the thickness of the layer.

It should be noted that in the case where an infrared absorbing agent is also added in the foregoing polymer layer, it is preferable that the optical density of the whole recording layer in a state of laminating the polymer layer and the infrared ray susceptible layer is in the range of 0.2–1.0.

[(B) Compounds Generating Radical]

As a compound preferably used for a radical initiator in the present invention, onium salt, specifically, iodonium salt, diazonium salt and sulfonium salt are listed. These onium salts function as an acid generation agent. However, when used with a radical polymeric compound described later, they function as an initiator of a radical polymerization. Onium salts suitably used in the present invention are onium salts represented by the following general formulae (III)–(V).

General formula (III)

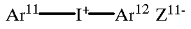

General formula (IV)

General formula (V)

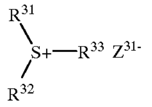

In the formula (III) $Ar^{11}$ and $Ar^{12}$ represent an aryl group having a carbon atom number of 20 or less, and which may have a substituent, respectively and independently. As the preferred substituents in the case where the aryl group has a substituent, a halogen atom, nitro group, alkyl group having a carbon atom number of 12 or less, alkoxy group having a carbon atom number of 12 or less, or aryloxy group having a carbon atom number of 12 or less is listed. $Z^{11-}$ represents a counter ion selected from the group containing a halogen ion, a perchlorate ion, tetrafluoroborate ion, hexafluorophosphate ion, and sulfonate ion, and preferably a perchlorate ion, hexafluorophosphate ion, and arylsulfonate ion.

In the formula (IV), $Ar^{21}$ represents an aryl group which has a carbon atom number of 20 or less and may have a substituent. As the preferable substituent, a halogen atom, nitro group, alkyl group having a carbon atom number of 12 or less, alkoxy group having a carbon atom number of 12 or less, aryloxy group having a carbon atom number of 12 or less, alkylamino group having a carbon atom number of 12 or less, dialkylamino group having a carbon atomnumber of 12 or less, arylamino group having a carbon atom number of 12 or less, or diarylamino group having a carbon atom number of 12 or less is listed. $Z^{21-}$ represents the counter ion which has the same meaning as $Z^{11-}$.

In the formula (V), it is preferable if $R^{31}$, $R^{32}$ and $R^{33}$ are either identical with or different from each other, respectively, and represent hydrocarbon group which have a carbon atomnumber of 20 or less and whichmayhave a substituent. As the preferable substituents, a halogen atom, nitro group, alkyl group having a carbon atom number of 12 or less, alkoxy group having a carbon atom number of 12 or less, or aryloxy group having a carbon atom number of 12 or less is listed. $Z^{31-}$ represents the counter ion which has the same meaning as $Z^{11-}$.

In the present invention, as onium salt which is preferably capable of being used, onium salt described in the description from the number of paragraph [0030] to the number of paragraph [0033] in the specification of Japanese Patent Application No. 11-310623 is capable of being listed.

As for a radical initiator employed in the present invention, its absorption wavelength maximum is preferably 400 nm or less, and further, more preferably 360 nm or less. In this way, by setting absorption wavelength in the range of ultraviolet region, the manipulation of a planographic printing plate is capable of being carried out under an incandescent lamp.

These onium salts are capable of being added in the infrared ray susceptible layer coating liquid in the ratio of 0.1–50% by weight with respect to the total solid contents of the infrared ray susceptible layer, preferably 0.5–30% by weight, and particularly preferably 1–20% by weight. In the case where the amount of an addition is less than 0.1% by weight, the sensitivity is lowered, and in the case where the amount exceeds over 50% by weight, scummings are caused on non-image portions during printing. As to these onium salts, one kind of them may be used or two kinds of them or more may be used in combination. Moreover, these onium salts may be added with the other components to the same layer, or if another layer is provided, the onium salts may be added to that layer.

[(B) Radical Polymeric Compound]

A radical polymeric compound used for the present invention is a radical polymeric compound having at least one ethylene type unsaturated double bond, selected from the compounds having at least one terminal ethylene type unsaturated bond, preferably two or more terminal ethylene type unsaturated bonds. Such a group of compounds is widely known in the art; in the present invention, these are capable of being used without any particular limitations. These have chemical forms such as for example, monomer, pre-polymer, namely, dimer, trimer and oligomer, or a mixture of these or copolymer of these. As examples of monomer and copolymer thereof, unsaturated carbonic acid (e.g., acrylic acid, metacrylic acid, itaconic acid, crotonic acid, isocrotonic acid, maleic acid or the like), and esters, amides thereof are listed. Preferably esters of unsaturated carbonic acid and aliphatic multivalent alcoholic compound, amides of unsaturated carbonic acid and aliphatic multivalent amine compound are employed. Moreover, an unsaturated carbonic acid ester having a nucleophilic substituent such as hydroxy group, amino group, mercapto group and the like, amides and monofunctional or polyfunctional isocyanates, adducts and reactants with epoxys, hydration and condensation reactants with monofunctional or polyfunctional carbonic acid or the like are also preferably used. Moreover, adducts and reactants of unsaturated caronic acid ester or amides having an electrophilic substituent such as isocyanate group, epoxy group or the like and monofuntional or polyfunctional alcohols, amines and thiols, further, substitution reactants of unsaturated carbonic acid ester or amides having eliminating substituents such as halogen group, tosyloxy group or the like, and monofunctional or polyfunctional alcohols, amines and thiols are also preferable. Moreover, as the other example, a group of compounds in which unsaturated sulfonic acid, styrene or the like has been replaced instead of the above mentioned unsaturated carbonic acid is capable of being also used.

Specific examples of radical polymeric compounds which are esters of aliphatic multivalent alcoholic compound and unsaturated carbonic acid, i.e., acrylic esters, methacrylic esters, itaconic esters, crotonic esters, isocrotic esters, maleic esters, are described in the description from paragraph[0037] to paragraph[0042] in the specification of Japanese Patent Application No. 11-310623, these are capable of being applied to the present invention.

As the other examples of esters, for example, aliphatic alcoholic esters described in Japanese Patent Application Publication No. 46-27926, JP-B No. 51-47334, and JP-A No. 57-196231, compounds having aromatic skeleton described in JP-A No. 59-5240, JP-A No. 59-5241, JP-A No. 2-226149, compounds containing amino group mentioned in JP-A No. 1-165613 and the like are preferably employed.

Moreover, as specific examples of monomers of amides of aliphatic multivalent amine compound and unsaturated carbonic acid, methylenebis-acrylamide, methylenebis-methacrylamide, 1,6-hexamethylene bis-acrylamide, 1,6-hexamethylene bis-methacrylamide, diethylene triamine triacrylamide, xylene bis acrylamide, xylene bis methacrylamide and the like are listed.

As the other preferable examples of amide monomers, compound having cyclohexylene structure mentioned in JP-B No. 54-21726 is capable of being listed.

Moreover, urethane based addition polymeric compounds manufactured by adding isocyanate and hydroxyl groups are also preferable, and as such specific examples, for example, vinyl urethane compounds containing polymeric vinyl group of two or more in one molecule, in which vinyl monomer containing hydroxyl group represented by the following formula (VI) is added to polyisocyanate compound having an isocyanate group of two or more in one molecule described in JP-B No. 48-41708 and the like are listed.

General Formula (IV)

$$CH_2{=}C\ (R^{41})\ COOCH_2CH\ (R^{42})\ OH$$

(provided that $R^{41}$ and $R^{42}$ represent H or $CH_3$)

Moreover, urethane acrylates as described in JP-A No. 51-37193, JP-B No. 2-32293, JP-B No. 2-16765, urethane compounds having ethylene oxide skeleton described in JP-B No. 58-49860, JP-B No. 56-17654, JP-B No. 62-39417, JP-B No. 62-39418 are also preferable.

Furthermore, it is also preferable if radical polymeric compounds having amino structure and sulfide structure within a molecule as described in JP-A No. 63-277653, JP-A No. 63-260909, and JP-A No. 1-105238 are employed.

As the other examples, polyfunctional acrylate and methacrylate such as polyester acrylates and epoxy acrylates obtained by reaction of epoxy resin and (meth) acrylic acid as described in respective publications of JP-ANO. 48-64183, JP-B No. 49-43191, and JP-B No. 52-30490 are capable of being listed. Moreover, a specific unsaturated compound described in JP-B No. 46-43946, JP-B No. 1-40337, JP-B No. 1-40336 and vinyl sulfonic acid compound mentioned in JP-A No. 2-25493 and the like are capable of being listed. Moreover, in some cases, a structure containing perfluoroalkyl group described in JP-A No. 61-22048 is preferably used. Furthermore, compound which has been introduced as photo-curing monomer and oligomer in Journal of Japanese Adhesion Association Vol. 20, No. 7, pp. 300–308 (1984) is also capable of being used.

As for these radical polymeric compounds, a method of the use of these compounds in detail can be optionally set, for example, what kind of structure is used, whether it is used separately or in combination, how much an amount of addition is, and so forth according to the performance design of the final recording material. From the viewpoint of the sensitivity, a structure having a large amount of contents of unsaturated groups is preferable, and in most cases, a structure having two or more of function groups is preferable. Moreover, in order to enhance the strength of an image portion, that is, a hardened film, a structure having three or more function groups is good, and furthermore, a method of adjusting both the photosensitivity and strength using compounds having different function numbers and different polymeric groups (e.g., acrylic ester based compound, methacrylic ester based compound, styrene based compound and the like) in combination is also effective.

The preferable blending ratio of the radical polymeric compound is, in most cases, 5–80% by weight with respect to the total of the components, and preferably 20–75% by weight. Moreover, it is also preferable if these are used singly or two or more of them are used in combination. Besides these, as for a method of utilizing radical polymeric compounds, it is possible to optionally select an appropriate structure, a blending, an amount of an addition from the viewpoints of degrees of inhibition of polymerization with respect to oxygen, resolution, fogging, refractive index change, surface adhesion and so forth, and furthermore, depending on the cases, a layer structure and a method of coating such as an under coating, an over coating and so forth are also capable of being carried out.

[(D) Binder Polymers]

In the present invention, further, a binder polymer is used. As a binder, a linear organic polymer is preferably used. As for such "linear organic polymers", it is preferable if any one of them is used. Preferably, a linear organic polymer which is soluble in water or alkalescent water or has swelling property is selected in order to enable a water develoment or an alkalescent water development. A linear organic polymer is selectively used not only as a coating forming agent for forming an infrared ray susceptible layer, but also as water, alkalescent water or an organic solvent developing agent according to the use. For example, if an organic polymer soluble in water is employed, a water development is capable of being carried out. As such linear organic polymers, radical polymers having a carboxylic acid group on the side chain, that is, methacrylic acid copolymer, acrylic acid copolymer, itaconic acid copolymer, crotonic acid copolymer, maleic acid copolymer, partial esterified maleic acid copolymer and the like described in, for example, JP-A No. 59-44615, JP-B No. 54-34327, JP-B No. 58-12577, JP-B No. 54-25957, JP-A No. 54-92723, JP-A No. 59-53836, JP-A No. 59-71048 are listed. Morover, similarly, acidic cellulose derivative having a carboxylic acid group on the side chain is also listed. Besides these, a compound in which cyclic acidic anhydride is added to a polymer having hydrocarbon group and the like i useful.

Among these, particularly, (meth) acrylic resin having a benzyl group or an aryl group and a carboxylic acid group on the side chain is exellent in the balance between film strength, sensitivity and developing property, and preferable.

Moreover, as a binder polymer, a polymer compound soluble in an alkaline aqueous solution listed as a material for the first layer is also capable of being used.

Moreover, since urethane based binder polymers containing an acid radical described in JP-B No. 7-12004, JP-B No. 7-120041, JP-B No. 7-120042, JP-B No. 7-12424, JP-B No. 8-12424, JP-A No. 63-287944, JP-A No. 63-287947, JP-A No. 1-271741, Japanese Patent Application No. 10-116232 and so forth are remarkably excellent in strength, and are advantageous in printing durability and lower light exposure suitability.

Furthermore, besides those described above, as linear organic polymers soluble in water, polyvinyl pyrrolidone and polyethyleneoxide and the like are useful. Moreover, in order to enhance the strength of hardened coating film, polyethers such as nylon soluble in alcohol and 2-bis-(4-hydroxyphenyl)-propane and epichlorohydrin and the like are also useful.

The weight average molecular weight of polymers used in the present invention is preferably 500 or more, and more preferably in the range of 10,000–300,000, and the number average molecular weight of polymers used in the present invention is preferably 1,000 or more, and more preferably in the range of 2,000–250,000. The polydispersity (weight average molecular weight/number average molecular weight) is preferably 1 or more, and more preferably in the range of 1.1–10.

These polymers are preferable if they are selected from any one of a random polymer, a block polymer, a graft polymer and the like, however, the random polymer is preferable.

The binder polymers used in the present invention are preferable if they are used singly or in combination. These polymers are added in the infrared ray susceptible layer at the ratio of 20–95% by weight with respect to the total solid contents of the infrared ray susceptible layer coating liquid, preferably 30–90% by weight. If the amount of addition is less than 20% by weight, the strength of an image portion is inadequate when image formation is carried out. Moreover, if the amount of addition exceeds over 95% by weight, an image is not formed. Moreover, a compound having ethylene type unsaturated double bond capable of radical-polymerizing and a linear organic polymer are blended at the weight ratio in the range of 1/9–7/3.

Next, constitutional components of an acidic cross-linking layer will be described below. An infrared absorbing agent used here is not necessarily an essential component. However, from the viewpoint of sensitivity enhancement, it is preferable that an infrared absorbing agent is contained. As infrared absorbing agents capable of being used in an acid cross-linking layer, similar ones to (A) infrared absorbing agent described in the foregoing photopolymeric layer are capable of being listed.

As described above in the paragraphs concerning the infrared ray susceptible layer, the contents are preferably an amount capable of suppressing ablation of the second layer.

[(E) Acid Generating Agents]

In the present embodiment of the present invention, an acid generating agent for generating an acid by decomposing due to heat is referred to a compound which generates an acid by irradiating with light in the wavelength region of 200–500 nm or heating to 100° C. or more.

As the foregoing acid generating agents, the known compounds and their mixtures and the like for performing thermal decomposition and generating an acid, such as known acid generating agents used for an initiator for cationic photopolymerization, an initiator for radical photopolymerization, decolorizing agent of pigments, light discoloring agent or a microresist are listed.

For example, diazonium salt described in S. I. Schlesinger, Photogr. Sci. Eng., 18, 387 (1974), T. S. Bal et al. Polymer, 21, 423 (1980), ammonium salt described in the specification of U.S. Pat. No. 4,069,055, JP-A No. 4-36504 and so forth, phosphonium salt described in the respective specifications of U.S. Pat. No. 4,069,055 and U.S. Pat. No. 4,069,056, iodonium salt described in the specifications of European Patent No. 104,143, U.S. Pat. No. 339,049 and U.S. Pat. No. 410,201, and JP-A No. 2-150848 and JP-A No.

2-296514, sulfonium salt described in the respective specifications of European Patent No. 370,693, European Patent No. 390,214, European Patent No. 233,567, European Patent No. 297,443, and European Patent No. 297,442, U.S. Pat. No. 4,933,377, U.S. Pat. No. 161,811, U.S. Pat. No. 410,201, U.S. Pat. No. 339,049, U.S. Pat. No. 4,760,013, U.S. Pat. No. 4,734,444, and U.S. Pat. No. 2,833,827, D.E. Patent No. 2,904,626, and D.E. Patent Nos. 3,604,580, 3,604,581, selenonium salt described in J. V. Crivello et al., Macromolecules, 10 (6), 1307 (1977), J. V. Crivello et al., J. Polymer Sci., Polymer Chem. Ed., 17, 1047 (1979), onium salts such as arsonium salt and the like described in C.S. Wen et al., The, Proc. Conf. Rad. Curing ASIA, pp. 478, Tokyo, Oct (1988), organic halogen compound described in the specification of U.S. Pat. No. 3,905,815, JP-B NO. 46-4605, JP-A NO. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, JP-A No. 63-298339, organic metal/organic halide described in JP-A No. 2-161445, optically acid generating agent having o-nitrobenzyl type protective group described in European Patent No. 0290,750, European Patent No. 046, 083, European Patent No. 156,535, European Patent No. 271,851, and European Patent No. 0,388,343, the respective specifications of U.S. Pat. No. 3,901,710, and U.S. Pat. No. 4,181,531, JP-A No. 60-198538, and JP-A No. 53-133022, compounds for generating sulfonic acid by performing photolysis represented by iminosulfonate and the like described in European Patent No. 0,199,672, European Patent No. 84515, European Patent No. 199,672, European Patent No. 044,115, and European Patent No. 0101,122, the specifications of U.S. Pat. No. 4,618,564, U.S. Pat. No. 4,371,605, and U.S. Pat. No. 4,431,774, JP-A No. 64-18143, JP-A No. 2-245756, and Japanese Patent Application No. 3-140109, disulfone compound described in JP-A No. 61-166544 are capable of being listed.

Moreover, compounds in which groups or compounds for generating these acids are introduced in the main chain or side chain of a polymer described in the respective specifications of U.S. Pat. No. 3,849,137, and D.E. Patent No. 3,914,407, JP-A NO. 63-26653, JP-ANO. 55-164824, JP-A NO. 62-69263, JP-A No. 60-146037, JP-A NO. 63-163452, JP-A NO. 62-153853, JP-A No. 63-146029 are listed.

Furthermore, compounds for generating an acid due to light described in V. N. R. Pillai, Synthesis, (1), 1 (1980), A. Abad et al., Tetrahedron Lett., (47) 4555 (1971), D. H. R. Barton et al., J. Chem. Soc., (B), 329 (1970), the respective specifications of U.S. Pat. No. 3,779,778 and European Patent No. 126,712 and so forth are also capable of being used.

Out of the above-described acid generating agents, compounds represented by the following general formulae (I)–(V) are preferable.

(I)

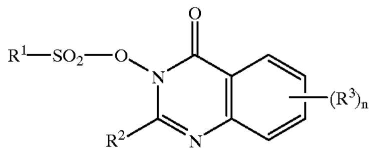

-continued (II)

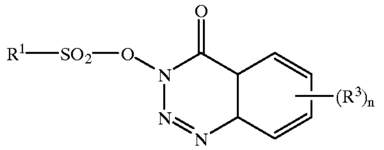

(III)

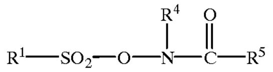

(IV)

$Ar^1—SO_2—SO_2—Ar^2$ (V)

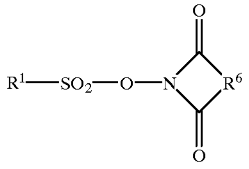

In the foregoing general formulae (I)–(V), it is also preferable if $R^1$, $R^2$, $R^4$ and $R^5$ are either identical with or different from each other, respectively, and each of them represents a hydrocarbon group having carbon atoms of the numbr of 20 or less, which may have a substituent. $R^3$ represents a hydrocarbon group having a carbon atom number of 10 or less which may have a halogen atom and a substituent or alkoxy group having a carbon atom number of 10 or less. It is preferable if $Ar^1$ and $Ar^2$ are either identical with or different from each other, respectively, each of them represents an aryl group having a carbon atom number of 20 or less which may have a substituent. $R^6$ represents a bivalent hydrocarbon group having a carbon atom number of 20 or less which may have a substituent. n represents an integer of 0–4.

In the foregoing formulae, $R^1$, $R^2$, $R^4$ and $R^5$ are preferably a hydrocarbon group having a carbon atom number of 1–14, respectively.

Preferred aspect of an acid generating agent represented by the foregoing general formulae (I)–(V) is described in detail in the description from paragraph[0197] to paragraph [0222] of the specification of Japanese Patent Application No. 11-320997 which had been previously proposed by the present inventors. These compounds are capable of being synthesized by methods, for example, described in JP-A No. 2-100054, and JP-A No. 2-100055.

Moreover, as (E) acid generating agent, onium salts which make a halide, sulfonic acid or the like a counter ion are capable of being listed. Among onium salts, the onium salts having any one of the structural formulae of iodonium salt, sulfonium salt and diazonium salt represented by general formulae (VI) to (VIII) are preferably capable of being listed.

$Ar^3—I^+—Ar^4\ X^-$ General formula (VI)

General formula (VII)

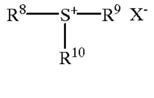

$Ar^3—N_2^+\ X^-$ General formula (VIII)

In the foregoing general formulae (VI)–(VIII), X represents a halide ion, $ClO_{4-}$, $PF_{6-}$, $SbF_{6-}$, $BF_{4-}$ or $R^7SO_{3-}$, wherein $R^7$ represents a hydrocarbon group having carbon atoms of the number of 20 or less, which may have a substituent. $Ar^3$, and $Ar^4$ represent a hydrocarbon group having carbon atoms of the number of 20 or less, independently, which may have a substituent. $R^8$, $R^9$, $R^{10}$ represent a hydrocarbon group having carbon atoms of the number of 18 or less, which may have a substituent.

These onium salts are described in the description from paragraph[0010] to paragraph[0035] in JP-A No. 10-39509 as compounds represented by the general formulae (I)–(III).

As for the amount of addition of an acid generating agent, it is preferably 0.01–50% by weight with respect to the total solid contents weight of the recording layer, more preferably 0.1–25% by weight, and most preferably 0.5–20% by weight.

If the foregoing amount of addition is less than 0.01% by weight, an image is not obtained, and if the foregoing amount of addition exceeds over 50% by weight, scummings may be generated in a non-image portion during the printing in the case of being used as a planographic printing plate.

The above-described acid generating agents are available if they are used singly or in combination.

[(F) Cross-linking Agents]

Next, Cross-linking agents will be described below. As cross-linking agents, the following are listed:

(i) aromatic compounds substituted by hydroxymethyl group or alkoxymethyl group, (ii) compounds having N-hydroxymethyl group, N-alkoxymethyl group or N-acyloxymethyl group, (iii) epoxy compounds.

Hereinafter, compounds of the foregoing (i)–(iii) will be described below.

As the foregoing (i) aromatic compounds substituted by hydroxymethyl group or alkoxymethyl group, for example, aromatic compounds or heterocyclic compounds polysubstituted by hydroxymethyl group, acetoxymethyl group or alkoxymethyl group are listed. However, resinous compounds in which phenols and aldehydes known as resol resins are condensed and polymerized under the basic conditions are also included.

Among aromatic compounds or heterocyclic compounds polysubstituted by hydroxymethyl group or alkoxymethyl group, compounds having a hydroxymethyl group or alkoxymethyl group at the position adjacent to a hydroxy group are preferable.

Moreover, among aromatic compounds or heterocyclic compounds polysubstituted by alkoxymethyl group, compounds having an alkoxymethyl group having a carbon atom number of 18 or less are preferable, and compounds represented by the following general formulae (1)–(4) are more preferable.

General formula 1

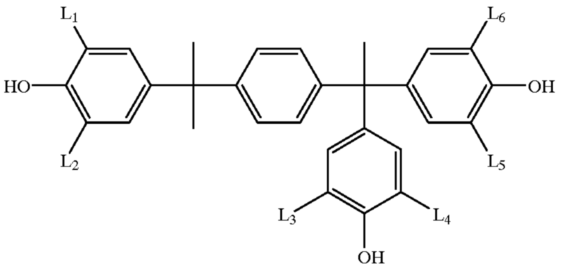

-continued

General formula 2

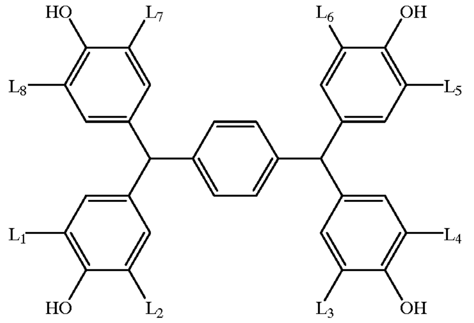

General formula 3

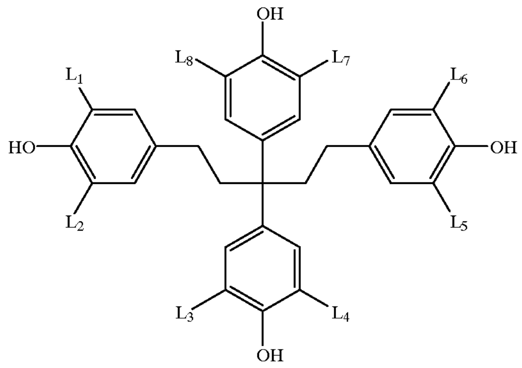

General formula 4

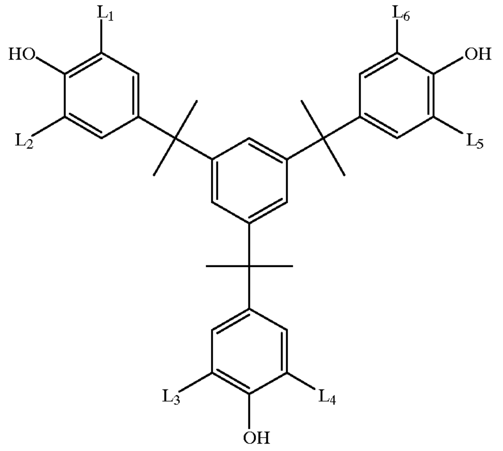

In the foregoing general formulae (1)–(4), each of $L^1$ to $L^8$ represents a hydroxymethyl group or alkoxymethyl group substituted by an alkoxy group having a carbon atom number of 18 or less, that is, methoxymethyl, ethoxymethyl and the like.

These cross-linking agents are high in cross-linking efficiency, and preferable from the viewpoint of being capable of enhancing the printing durability.

As (ii) compounds having N-hydroxymethyl group, N-alkoxymethyl group or N-acyloxymethyl group, monomer and oligomer-melanin-formaldehyde condensation products and urea-formaldehyde condensation products described in European Patent Publication (hereinafter, referred to as "EP-A") No. 0,133,216, D.E. (West Germany) Patent No. 3,634,671, and D.E. (West Germany) Patent No. 3,711,264, and alkoxy substituted compounds described in the specification of EP-A No. 0,212,482 are listed.

Among them, melanin-formaldehyde derivatives having at least free N-hydroxymethyl group, N-alkoxymethyl group or N-acyloxymethyl group are preferable, and N-alkoxymethyl derivatives are most preferable.

As (iii) epoxy compounds, monomeric compounds, dimeric compounds, oligomeric compounds, and polymeric epoxy compounds having more than one of an epoxy group are listed. For example, a reaction product generated beween bis-phenol A and epichlorhydrin, a reaction product generated between low molecular weight phenol-formaldehyde resin and epichlorhydrin and the like are listed.

Besides these, epoxy resins described in the respective specifications of U.S. Pat. No. 4,026,705, and G. B. Patent No. 1,539,192 and used are listed.

As for the amount of addition of a cross-linking agent, it is preferably 5–80% by weight with respect to the total solid contents weight of the infrared ray susceptible layer, more preferably 10–75% by weight, and most preferably 20–70% by weight.

If the foregoing amount of addition is less than 5% by weight, the obtainable durability of the infrared ray susceptible layer of image recording materials may be lowered, and if the foregoing amount of addition exceeds over 80% by weight, the stability during conservation may be lowered.

In the present invention, as cross-linking agents, phenol derivatives represented by (iv) the following general formula (5) are also preferably capable of being used.

General formula 5

General formula 5

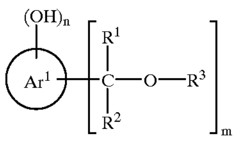

In the foregoing general formula (5), $Ar^1$ represents an aromatic hydrocarbon ring which may have a substituent.

From the viewpoint of availability of the raw materials, as the foregoing aromatic hydrocarbon ring, benzene ring, naphthalene ring or anthracene ring are preferable. Moreover, as substituents, a halogen atom, hydrocarbon group having a carbon atom number of 12 or less, alkoxy group having a carbon atom number of 12 or less, alkylthio group having a carbon atom number of 12 or less, cyano group, nitro group, trifluoromethyl group and the like are preferable.

From the viewpoint of being capable of highly enhancing the sensitivity, among the above-described ones, as $Ar^1$, a benzene ring not having a substituent, a naphthalene ring or a benzene ring or naphthalene having as a substituent a halogen atom, a hydrocarbon group having a carbon atom number of 6 or less, an alkoxy group having a carbon atom number of 6 or less, an alkylthio group having a carbon atom number of 6 or less or nitro group and the like are more preferable.

[(G) Polymer Compounds Soluble in an Alkaline Aqueous Solution]

As polymer compounds soluble in an alkaline aqueous solution capable of being used of the present invention, among polymers soluble in an alkaline aqueous solution described in detail in the paragraphs describing about the polymer layer, particularly, a novolak resin and a polymer having a hydroxyaryl group in the side chain and the like are listed. As the foregoing novolak resins, resins in which phenols and aldehydes are condensed under acid conditions are listed.

In the present invention, since the hardened region of the infrared ray susceptible layer functions as an alkaline developing liquid resist coating film for a polymer layer between the supporting body and the infrared ray susceptible layer, it is preferable that polymers soluble in an alkaline aqueous solution constituting the infrared ray susceptible layer and the polymer layer are selected to not be phase soluble with each other.

Now, the state of being phase insoluble with each other means that the combination of two kinds of polymers (including the case where they are a copolymer or a mixture of one phase of two kinds, repectively) is not a solid of one phase nor a liquid by appearances. It is possible to confir this by mixing both and visual observation or shooting a sectional view photograph and observing it.

As fundamental compounds of polymers used for the combination of two polymers or more which are phase insoluble with each other, urethane series polymer compounds, acryl series polymer compounds, styrene series polymer compounds, novolak resins, diazo resins, amide series polymer compounds, polyether compounds and the like are listed. By introducing the foregoing acidic group to these polymers, these polymers are capable of being soluble in an alkaline developing liquid. It should be noted that as preferred combinations, acryl series or urethane series polymer compounds and novolak resin, novolak resin and diazo resin, acryl series or urethane series polymer compounds and diazo resin are listed.

[Other Components]

In the present invention, it will be good if a variety of compounds besides these are further addeds according to necessity. For example, a dye having a large absorption in the visible light region is capable of being used as a coloring agent. Moreover, pigments such as phthalocyanine series pigments, azo series pigments, carbon black, titanium oxide and the like are capable of being preferably used.

It is preferable to add these coloring agents since an image portion and a non-image portion are distinguishable from each other by employing these coloring agents. It should be noted that the amount of addition is added at the ratio of 0.01–10% by weight with respect to the total solid contents of an infrared ray susceptible layer coating liquid.

Moreover, in the present invention, in the case where the infrared ray susceptible layer is a photopolymerization layer, it is desirable to add a slight amount of a thermal polymerization inhibitor in order to inhibit unnecessary thermal polymerization of the compound having ethylene type unsaturated double bond capable of performing a radical polymerization during the preparation or conservation of the coating liquid. As suitable thermal polymerization inhibitors, hydroquinone, p-methoxyphenol, di-t-butyl-p cresol, pyrogallol, t-butylcatechol, benzoquinone, 4,4'-thio bis (3-methyl-6-t-butylphenol), 2,2'-methylene bis (4-methyl-6-t-butylphenol), N-nitroso-N-phenylhydroxylamine alminium salt and the like are listed. The ratio of an amount of an addition of a thermal polymerization inhibitor is preferably in the range of about 0.01% by weight—about 5% by weight to the total weight of the entire components. Moreover, it is also good if a higher fatty acid derivative such as behenic acid and behenic amide and so forth is added in order to prevent polymerization inhibition due to oxygen according to the necessity and localized on the surface of the photosensitive layer in the drying process following the coating process. The ratio of the amount of addition of the higher fatty acid derivative is preferably in the range of about 0.1% by weight—about 10% by weight of the total components.

Moreover, in the present invention, to the coating liquid of the infrared ray susceptible layer, a nonionic surfactant as described in JP-A No. 62-251740 and JP-A No. 3-208514 and an ampholytic surfactant as described in JP-A No. 59-121044, JP-A No. 4-13149 are capable of being added in order to widen the stability of the treatment with respect to the developing conditions.

Furthermore, to the infrared ray susceptible layer coating liquid in the present invention, a plasticizer is added in order to give the flexibility of a coating film and the like according to necessity. For example, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate and the like are employed.

In order to manufacture a planographic printing plate of the present invention, it will be sufficient that the foregoing respective components necessary to the infrared ray susceptible layer coating liquid is normally dissolved in a solvent and is coated on a suitable supporting body. As solvents used here, ethylenedichloride, cyclohexanone, methylethylketone, methanol, ethanol, propanol, ethylene glycol monomethylether, 1-methoxy-2-propanol, 2-methoxyacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyllactone, toluene, water and the like are capable of being listed. However, the present invention is not limited to these. These solvents are used separately or by blending two of them or more into a mixture. The concentration of the above-described components in a solvent (the total solid contents including additives) is preferably 1–50% by weight.

Moreover, as an infrared ray susceptible layer of the present invention, besides the above-described photopolymerization layer, and acid cross-linking layer, the known covalent bond formation type recording layer is capable of being applied. Specifically, for example, the combination of an infrared absorbing agent described in JP-A No. 7-306528, which had been previously proposed by the present applicant and diazonium compound having two or more diazonio groups within the molecule, and a negative type image recording material containing an infrared absorbing agent described in JP-A No. 9-43845, and apolymer compound having a specific repeating unit having a side chain for generating an acid due to heat and the like are capable of being applied as a component of the infrared ray susceptible layer.

Referring to the amount of coating of these recording layers, the coating amount of the polymer layer (solid content) on the supporting body obtained after coating and drying is different depending on the use. However, in the case where the present invention is used as a planographic printing plate, in general, it is preferably 0.1–5.0 $g/m^2$, and as the coating amount of the infrared ray susceptible layer, from the viewpoints of sensitivity, printing durability, and strength of the coating film, in general, it is preferably 0.5–5.0 $g/m^2$.

Although a variety of methods are capable of being used as a coating method, for example, bar coater coating, rotation coating, spray coating, curtain coating, dip coating, air knife coating, blade coating, roll coating and the like are capable of being listed.

[Supporting Body]

A supporting body is in a dimensionally stable plate form, for example, a paper, a plastic (e.g., polyethylene, polypropylene, polystyrene and the like)-laminated paper, a metal plate (e.g., aluminum, zinc, copper and the like), a plastic film (e.g., diacetylcellulose, triacetylcellulose, cellulose propionate, cellulose butyrate, cellulose butyrate acetate, cellulose nitrate, polyethylene terephthalate, polyethylene, polystyrene, polypropylene, polycarbonate, polyvinyl acetal and the like), a paper or plastic film on which the metal as described is laminated or vapor deposited, and the like are listed.

As a supporting body used in the present invention, a polyester film or an aluminum plate is preferable, and an aluminum plate is particularly preferable out of them, which is dimensionally stable and relatively inexpensive. The preferable aluminum plate is an alloy plate which is mainly made of pure aluminum plate and aluminum and which contains traces of other elements, or further, it is also preferable if it is a plastic film on which aluminum is laminated or vapor deposited. The other elements contained in aluminum alloy include silicon, iron, manganese, copper, magnesium, chromium, zinc, bismuth, nickel, titanium and the like. The maximum content of the other elements in an alloy is 10% by weight or less. Although particularly preferable aluminum in the present invention is pure aluminum, since it is difficult to manufacture perfectly pure aluminum in terms of refining technology, it is also preferable even if aluminum contains traces of the other elements. In this way, since the components of an aluminum plate applied to the present invention are not specified and defined, an aluminum which is conventionally known and used is capable of being utilized as appropriate.

The thickness of an aluminum plate used in the present invention is approximately on the order of 0.1–0.6 mm, preferably 0.15–0.4 mm, and in particular, preferably 0.2–0.3 mm.

Although the aluminum plate has been previously roughened, prior to the roughening of the surface of an aluminum plate, depending upon the desired request, a degreasing treatment is carried out by, for example, a surfactant, an organic solvent, an aqueous alkaline solution and the like for the purpose of removing a rolling oil from the surface of the aluminum plate.

Although the roughening of the surface of an aluminum plate is carried out by a variety of methods, for example, the roughening is carried out by a method of mechanically roughening, a method of electrochemically dissolving and roughening the surface, and a method of selectively dissolving the surface in a chemical manner. As mechanical methods, the known methods such as a method of polishing using a ball, a method of polishing using a brush, a method of polishing by blasting, a method of polishing by buffing and the like are capable of being employed. Moreover, as a method of electrochemically roughening, there are methods by which the roughening is carried out in hydrochloric acid or nitric acid electrolyte solution using alternative current or direct current. Moreover, a method of combining the both methods as disclosed in JP-A No. 54-63902 is also capable of being utilized.

The aluminum plate whose surface is roughened in this way, depending upon the desired request, is capable of being submitted to an anodic oxidation treatment via an alkaline etching treatment and a neutralizing treatment in order to enhance the properties of water retention and wear resistance of the surface according to the necessity. As electrolytes used for anodic oxidation treatment of an aluminum plate, various kinds of electrolytes forming a porous oxidation coating are capable of being utilized. In general, sulfuric acid, phosphoric acid, oxalic acid, chromic acid or a mixture of these acids is used as the electrolyte. The concentrations of these electrolytes are determined as appropriate depending upon the kinds of electrolytes.

Since the conditions of an anodic oxidation treatment are variously changed depending upon the electrolytes employed, the conditions cannot be specified in general. However, generally, if the concentration of an electrolyte is in the range of 1–80% by weight in solution, the temperature of the liquid is in the range of 5–70° C., the current density is in the range of 5–60 A/$dm^2$, the voltage is in the range of 1–100 V, and the electrolyte time is in the range of 10 sec–5 minutes, it can be said that the conditions are proper. As for the amount of an anodic oxidation coating, in the case where the amount of the anodic oxidation coating is less than 1.0 g/$m^2$, the printing durability is not sufficient, or a non-image portion of the planographic printing plate is easily scratched and what is called a "scratched smudge" phenomenon in which ink is attached on the portion of the relevant scratched flaw during the printing is easily caused.

A hydrophilic treatment for the surface of the supporting body is provided following the above-described anodic oxidation treatment. As such hydrophilic treatments used in the present invention, there is a method of alkaline metal silicate (e.g., sodium silicate aqueous solution and the like) as disclosed in U.S. Pat. No. 2,714,066, U.S. Pat. No. 3,181,461, U.S. Pat. No. 3,280,734 and U.S. Pat. No. 3,902,734. In this method, the supporting body is soaked in an aqueous solution of sodium silicate or electrolytically treated. Other methods such as a method of treating with potassium fluorozirconate disclosed in JP-B No. 36-22063, and a method of treating with polyvinyl phosphonic acid as disclosed in U.S. Pat. No. 3,276,868, U.S. Pat. No. 4,153, 461, U.S. Pat. No. 4,689,272, and so forth are employed.

An under coating layer can be provided between the supporting body and the polymer layer according to the necessity. As under coating components, a variety of organic compounds are employed and selected, for example, from carboxymethylcellulose, dextrin, gum arabic, phosphonic acids having amino group such as 2-aminoethylphosphonic acid and the like, organic phosphonic acids such as phenylphosphonic acid, naphthylphosphonic acid, alkylphosphonic acid, glycerophosphonic acid, methylenediphosphonic acid and ethylenediphosphonic acid, which may have a substituent, respectively, organic phosphoric acids such as phenylphosphoric acid, naphthylphosphoric acid, alkylphosphoric acid and glycerophosphoric acid, which may have a substituent, respectively, organic phosphinic acids such as phenylphosphinic acid, naphthylphosphinic acid, alkylphosphinic acid and glycerophosphinic acid, amino acids such as glycine and β-alanine and amine hydrochloride having hydroxy group such as triethanolamine hydrochloride. However, two kinds or more of these may be mixed and used.

Moreover, in the present invention, as already described, multifunctional amine compounds can be added in the under coating layer. In this case, the under coating layer may be formed with the above-described other organic compounds, or the under coating layer may be formed only by multifunctional amine compounds.

The amount of coating of the under coating layer is appropriately 2–200 mg/$m^2$, preferably 5–100 mg/$m^2$. If the above-described coating amount is less than 2 mg/$m^2$, a sufficient printing durability performance may not be obtained. Moreover, if it is more than 200 mg/$m^2$, a similar result may be obtained.

The planographic printing plate is usually subjected to image exposing and developing treatments, and an image is formed. As light sources of active light used for image exposing treatment, light sources having emitting wavelengths from near-infrared to infrared region are preferable, a solid state laser and a semiconductor laser are particularly preferable.

[Developing Liquid]

Developing liquid and replenishment liquid used for developing a planographic printing plate of the present invenition include alkaline developing liquid conventionally known. Preferably these include the following component.

(Alkali Agent)

Developing liquid and developing replenishment liquid used for developing a planographic printing plate of the present invention include aqueous solutions in the range of pH 9.0–13.5, and more preferably pH 10.0–13.3.

As such developing liquid and replenishment liquid, the conventionally known alkaline aqueous solutions are capable of being used. For example, inorganic alkaline agents such as sodium silicate, potassium silicate, sodium tertiaryphosphate, potassium tertiary phosphate, ammonium tertiary phosphate, sodium secondary phosphate, potassium secondary phosphate, ammonium secondary phosphate, sodium carbonate, potassium carbonate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithiumhydroxide or the like is listed. In addition, the organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropylamine, diisopropylamine, triisopropylamine, n-butylamine, monoethanolamine, diethanolamine, triethanolamine, monoisopropanolamine, diethanolamine, ethyleneimine, ethylenediamine, pyridine and the like are also employed.

Among these alkaline agents, silicate aqueous solutions such as sodium silicate and potassium silicate are preferable. The reason therefor is that pH and developing property can be adjusted by the ratio of silicon oxide $SiO_2$, which is the component of silicate, and alkaline metal oxide $M_2O$ (in general, represented by mole ratio of $[SiO_2]/[M_2O]$) and their concentrations. For example, if the mole ratio of $SiO_2/K_2O$ is 0.5–2.0 (i.e., $[SiO_2]/[K_2O]$ is 0.5–2.0), alkaline metal silicate comprising potassium silicate aqueous solution in which the contents of $SiO_2$ is in the range of 1–4% by weight is preferably used in the present invention.

Furthermore, as preferable other alkaline agents, buffer solutions containing weak acids and strong bases are listed. As for weak acids used as such buffer solutions, weak acids having acid dissociation constant (pKa) in the range of 10.0–13.3 are preferable, particularly preferably 11.0–13.1 pKa. Moreover, in the case of sulfosalicylic acid, the third acid dissociation constant is 11.7, and this is capable of being preferably used. Specifically, in the case of polybasic acid, if at least one of the acid dissociation constants is in the above-described range, that acid is capable of being used in the present invention.

As such weak acids, weak acids are selected from ones described in IONISATION CONSTANTS OF ORGANIC ACIDS IN AQUEOUS SOLUTION, published by Pergamon Press, and so forth. For example, alcohols such as 2,2,3,3, -tetrafluoropropanol-1 (pKa 12.74), trifluoroethanol (pKa 12.37), and trichloroethanol (pKa 12.24), aldehydes such as pyridine-2-aldehyde (pKa 12.68), and pyridine-4-aldehyde (pKa 12.05), sugars such as sorbitol (pKa 13.0), succharose (pKa 12.7), 2-deoxyribose (pKa 12.61), 2-deoxyglucose (pKa 12.51), glucose (pKa 12.46), galactose (pKa 12.35), arabinose (pKa 12.34), xylose (pKa 12.29), fructose (pKa 12.27), ribose (pKa 12.22), mannose (pKa12.08), and L -ascorbic acid (pKa 11.34), compounds having phenol type hydroxyl group such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxysulfonic acid (pKa 12.2), 3,4-dihydroxy benzoic acid (pKa 11.94), 1,2,4-trihydroxybenzene (pKa 11.82), hydroquinone (pKa 11.56), pyrogallol (pKa 11.34), and resorcinol (pKa 11.27), oxime such as 2-butanone oxime (pKa 12.45), acetoxime (pKa 12.42), 1,2-cycloheptanediondioxime (pKa 12.3), 2-hydroxybenzaldehyde oxime (pKa 12.10), dimethylglyoxime (pKa 11.9), ethanediamidedioxime (pKa 11.37), and acetophenone oxime (pKa 11.35), amino acids such as 2-quinolone (pKa 11.76), 2-pyridone (pKa 11.65), 4-quinolone (pKa 11.28), 4-pyridone (pKa 11.12), 5-amino valeric acid (pKa 10.77), 2-mercaptoquinoline (pKa 10.25), 3-aminopropionic acid (pKa 10.24), nucleic acid related substances such as fluorouracil (pKa 13.0), guanosine (pKa 12.6), uridine (pKa 12.6), adenosine (pKa 12.56), inosine (pKa 12.5), guanine (pKa 12.3), cytidine (pKa 12.2), cytosine (pKa 12.2), hypoxanthine (pKa 12.1), xanthine (pKa 11.9), andbesides these, others, weak acids such as diethylaminomethylphosphonic acid (pKa 12.32), 1-amino-3,3,3-trifluorobenzoic acid (pKa 12.29), isopropyridene-diphosphonic acid (pKa 12.10), 1,1,-ethylidenediphosphonic acid (pKa 11.54), 1,1-ethylidenediphosphonic acid 1-hydroxy (pKa 11.52), benzimidazole (pKa 12.86), thiobenzamide (pKa 12.8), picoline thioamide (pKa 12.55), barbituric acid (pKa 12.5) and the like are listed.

As strong bases with which these weak acids are combined, sodium hydroxide, ammonium hydroxide, potassium hydroxide and lithium hydroxide are employed.

These alkaline agents are employed singly or two of them or more are employed in combination.

Among these alkaline buffer agents, the agents in which sulfosalicylic acid, salicylic acid, saccharose and sorbitol, sodium hydroxide and potassium hydroxide are combined are preferable. Among the above-described, the combination of sorbitol and potassium hydroxide or sodium hydroxide is preferable.

The above-described various alkaline agents are used for adjusting pH in a preferable range through the concentration and combination.

[Surfactants]

To developing liquid and replenishment liquid used for developing a planographic printing plate of the present invenition, a variety of surfactants, organic solvents and the like are capable of being added according to the necessity for the purpose of promoting and suppressing the developing property, and dispersing the sludge generated when developing and enhancing the ink-philicity of the image portion of a printing plate.

As preferable surfactants, anionic surfactants, cationic surfactants, non-ionic surfactants and ampholytic surfactants are listed. As preferable examples of surfactants, non-ionic surfactants such as poly (oxyethylene) alkyl ethers, poly (oxyethylene) alkylphenyl ethers, poly (oxyethylene) polystyrenephenyl ethers, poly (oxyethylene) poly (oxypropylene) alkyl esters, glycerine fatty acid partial esters, sorbitan fatty acid partial esters, pentaerythritol fatty acid partial esters, poly (oxyethylene) sorbitan fatty acid partial esters, propyleneglycol mono fatty acid esters, sucrose fatty acid partial esters, poly (oxyethylene) sorbitan fatty acid partial esters, poly (oxyethylene) sorbitol fatty acid partial esters, polyethyleneglycol fatty acid esters, polyglycerine fatty acid partial esters, poly (oxyethylene) castor oil, poly (oxyethylene) glycerine fatty acid partial esters, fatty acid diethanolamides, N, N-bis-hydroxyalkylamines, poly (oxyethylene) alkylamines, triethanolamine fatty acid ester, trialkylamine oxide, anionic surfactants such as fatty acid salts, abietic acid salts, hydroxyalkanesulfonates, alkanesulfonates, dialkylsulfosuccinate salts, linear alkylbenzene sulfonates, branching alkylbenzene sulfonates, alkylnaphthalene sulfonates, alkylphenoxypoly (oxyethylene) propylsulfonates, poly (oxyethylene) alkylsulfophenyl ethers, N-methyl-oleyltaurinesodium salts, N-alkylsulfosuccinate monoamidedisodium salts, petroleum sulfonates, sulfation beef tallow oil, sulfuric ester salts of fatty acid alkyl ester, alkyl sulfuric ester salts, poly (oxyethylene) alkyl ether sulfuric ester salts, fatty acid monoglyceride sulfuric ester salts, poly (oxyethylene) styrylphenylether sulfuric ester salts, alkyl phosphoric ester salts, poly (oxyethylene) alkyl ether phosphoric ester salts, poly (oxyethylene) alkylphenyl ether phosphoric ester salts, partial saponifiable matters of styrene/maleic anhydride copolymer, partial saponifiable matters of olefin/maleic anhydride copolymer and naphthalene sulfonate formalin condensed matters, cationic surfactants such as alkylamine salts, quaternary ammonium salts of tetrabutylammoniumbromide, poly (oxyethylene) alkylamine salts, and polyethylene polyamine derivatives, and ampholytic surfactants such as carboxybetaines, aminocarboxylate salts, sulfobetaines, aminosulfuric esters, and imidazolines are listed. Among the listed surfactants, ones written as poly (oxyethylene) can be read as poly (oxyalkylene) such as poly (oxymethylene), poly (oxypropylene), and poly (oxybutylene), and these surfactants are also included.

Further preferred surfactants are fluorinated surfactants containing perfluoroalkyl group within their molecules. As such fluorinated surfactants, anionic type surfactants such as perfluoroalkyl carboxylate salts, perfluoroalkyl sulfonates, perfluoroalkyl phosphoric ester, ampholytic type surfactants such as perfluoroalkylbetaine, cationic type surfactants such as perfluoroalkyltrimethylammonium salt, and non-ionic type surfactants such as perfluoroalkylamine oxide, perfluoroalkylethylene oxide additives, oligomer containing perfluoroalkyl group and hydrophilic group, oligomer containing perfluoroalkyl group, hydrophilic group and lipophilic group, urethane containing perfluoroalkyl group and lipophilic group and the like are listed.

The above-described surfactants are capable of being used singly or in a combination of two kinds or more out of these, are preferably added in the range of 0.001–10% by weight, and more preferably in the range of 0.01–5% by weight in a developing liquid.

(Developing Stabilizers)

In developing liquid and replenishment liquid used in the present invention, a variety of developing stabilizers are employed. As preferred examples of them, polyethylene glycol additives of sugar alcohols, tetraalkylammonium salt such as tetrabutylammonium hydroxide, phosphonium salt such as tetrabutylphosphonium bromide, and iodonium salt such as diphenyliodonium chloride described in JP-A No. 6-28207 are listed.

Furthermore, anionic surfactants or ampholytic surfactants described in JP-A No. 50-51324, and cationic polymer soluble in water described in JP-A No. 55-95946, and ampholytic polymer electrolytes described in JP-A No. 56-142528 are capable of being listed.

Moreover, an organic boron compound to which alkylene glycol is added described in JP-A No. 59-84241, poly (oxyethylene) poly (oxypropylene) block polymerization type surfactant soluble in water described in JP-A No. 61-111246, alklylenediamine compound in which poly (oxyethylene) poly (oxypropylene) is substituted described in JP-A No. 60-129750, polyethylene glycol having a weight average molecular weight of 300 or more described in JP-A No. 61-215554, surfactant containing fluorine having cationic group described in JP-A No. 63-175858, ethylene oxide additive compound obtained by adding ethylene oxide of 4 moles or more in an acid or alcohol and polyalkylene compound soluble in water described in JP-A No. 2-39157 are listed.

(Organic Solvents)

Organic solvents are added in a developing liquid and replenishment liquid according to the necessity. As such organic solvents, those whose solublities in water are about 10% by weight or less are suitable, preferably selected from the solvents of 5% by weight or less. For example, 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methyl cyclohexanol, 3-methylcyclohexanol and 4-methylcyclohexanol, N-phenylethanolamine and N-phenyldiethanolamine are capable of being listed. The contents of organic solvents are 0.1–5% by weight to the total weight of liquid used. The usage volume is closely related, as the amount of an organic solvent is increased, it is preferable to increase the amount of a surfactant. This is because if the amount of a surfactant is slight and a large amount of an organic solvent is used, the organic solvent is not completely dissolved, accordingly a good developing property cannot be secured and cannot be expected.

(Reductants)

Reductants are further added in a developing liquid and replenishment liquid used in the present invention. This prevents sludge of the printing plate; particularly, it is effective when a negative type photosensitive planographic printing plate containing photosensitive diazonium salt compound is developed. As preferred organic reductants, phenol compounds such as thiosalicylic acid, hydroquinone, methol, methoxyquinone, resorcin, 2-methylresorcin, amine compounds such as phenylenediamine, and phenylhydrazine are listed. As further preferred inorganic reductants, sodium salts of inorganic acids such as sulfite, hydroacid sulfite, phosphorous acid, dihydroacid phosphite, thiosulfuric acid, and dithionite, potassium salt and ammonium salt are capable of being listed. Among these reductants, reductant particularly excellent in the effect of preventing sludges is sulfite. These reductants are preferably contained in the range of 0.05–5% by weight in a developing liquid during use.

(Organic Carboxylic Acids)

Organic carboxylic acids are capable of further being added in a developing liquid and replenishment liquid used in the present invention. The preferred ogranic carboxylic acids are aliphatic carboxylic acid and aromatic carboxylic acid having a carbon atom number of 6–20, respectively. As specific examples of aliphatic carboxylic acids, caproic acid, enanthylic acid, caprylic acid, lauric acid, myristic acid, palmitic acid and stearic acid are listed. Particularly preferred is alkanoic acid having a carbon atom number of 8–12. Moreover, it is preferable if unsaturated fatty acid having double bond in carbon chain or branching carbon chain is used.

As aromatic carboxylic acids, compounds whose carboxylic acid group is substituted by benzene ring, naphthalene ring, anthracene ring and the like, specifically, o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, 2-naphthoic acid are listed. However, hydroxynaphthoic acid is particularly effective.

The above-described aliphatic and aromatic carboxylic acids are preferably used as sodium salt, potassium salt or ammonium salt in order to enhance the water soluble property. As for the contents of an organic carboxylic acid in a developing liquid used in the present invention, there are no particular limitations. However, if it is lower than 0.1% by weight, the effect is not sufficient, and if it is 10% by weight or more, not only improvement of the effect is not realized but also dissolution may be inhibited when another additive is used in combination. Therefore, the preferred amount of an addition is 0.1–10% by weight with respect to a developing liquid during use, and more preferred is 0.5–4% by weight.

(Others)

An antifoaming agent and water softener and the like are capable of being further added in a developing liquid and replenishment liquid used in the present invention. As water softeners, for example, polyphosphoric acid and its sodium salt, potassium salt and ammonium salt, amino polycarboxylic acids such as ethylenediamine tetracetic acid, diethylenetriamine pentacetic acid, triethylene tetramine hexacetic acid, hydroxyethylethylenediamine triacetic acid, nitrilotriacetic acid, 1,2-diaminocyclohexanetetracetic acid and 1,3-diamino-2-propanol tetracetic acid and their sodium salts, potassium salts and ammonium salts, aminotri (methylene phosphonic acid), ethylenediamine tetra (methylene phosphonic acid), diethylenetriamine penta (methylene phosphonic acid), triethylene tetramine hexa (methylene phosphonic acid), hydroxyethylethylenediamine tri (methylene phosphonic acid) and 1-hydroxyethane-1,1-diphosphonic acid, and their sodium salts, potassium salts, and ammonium salts are capable of being listed.

The optimized values of these water softeners are changed by chelation force, hardness of hard water in use and the amount of hard water. If the general amount of use is indicated, the softener is added in the range of 0.01–5% by weight, and more preferably 0.01–0.5% by weight in a developing liquid during use. If it is less than this range of the amount of addition, the predetermined object is not achieved, and if the amount of addition is more than this range, undesirable influence with respect to the image portion such as decolorization and the like may occur.

Although the remaining component of a developing liquid and replenishment liquid is water, a variety of additives known in the art are capable of being further contained according to necessity.

The developing liquid for replenishment original liquid and its replenishment liquid used in the present invention has been previously prepared in a condensed liquid state in which the contents of water has been lessened compared to those during use, and is prepared by being diluted by water when it is used, which is advantageous when it is transported for use. In this case, the concentration is appropriately prepared to a degree such that each component does not undergo separation or precipitation.

The temperature of the developing liquid is preferably in the range of 15–40° C., and more preferably in the range of 20–35° C. The time of developing is preferably 5–60 seconds, and more preferably 7–40 seconds.

The planographic printing plate submitted to the developing treatment using the above-described developing liquid and replenishment liquid is post-treated with rinsing liquid containing washing water, a surfactant and the like, and a desensitized fatty liquid containing gum arabic or a starch derivative. For the purpose of a post-treatment in the case where a printing plate of a planographic printing plate of the present invention manufactured by the above-described method is used, a variety of combinations of these treatments are capable of being used.

In recent years, in the fields of plate making industry and printing industry, an automatic developing machine for a plate material for printing is widely used for the sake of rationalization and standardization of the plate making processes. In general, an automatic developing machine contains a developing section and post-treatment section, also containing a device for transferring plate materials for printing and the respective treatment solution tanks and a spraying device. In the automatic developing machine, while the printing plate already exposed is transferred in a horizontal direction, the respective treatment solution drawn by a pump is sprayed from spraying nozzles and submitted for developing treatment. Moreover, recently, there has been known a method of treating a plate material for printing being immersed and transferred by in-liquid guide roller and the like in the treatment liquid-filled treatment liquid tank. In such automatic treatments, the treatments are capable of being carried out while filling the replenishment liquid corresponding to the amount of treatment, working time and the like. Moreover, electrical conductivity is sensed by a sensor and the replenishment liquid is also capable of being automatically filled. Moreover, what is called a disposable treatment method of substantially treating by unused treatment liquid is also capable of being applied.

The planographic printing plate to which the above-described treatments have been provided and, depending upon the desired request, after coating desensitized fatty gum, the relevant planographic printing plate is capable of being provided in the printing process. However, in order to enhance the printing durability, a burning treatment may be provided. In the case where a printing plate of a planographic printing plate is burned, a treatment is preferably carried out by a surface regulating liquid as described in the respective specifications of JP-B No. 61-2518; 55-28062; JP-A No. 62-31859; 61-159655, prior to the burning process. As a method of carrying out the treatment, a method of coating a surface regulating liquid on the printing plate of a planographic printing plate using a sponge or absorbent cotton soaked with the relevant surface regulating liquid or of the printing plate being immersed and coated in a vat filled with the surface regulating liquid, and a method of coating the surface regulating liquid by an automatic coater are applied. Moreover, better results will be preferably given if the amount of coating is flattened by a squeezing apparatus or a squeezing roller after coating. As to an amount of a surface regulating liquid, generally 0.03–0.8 $g/m^2$ (dry weight) is appropriate.

After drying, if it is required, the printing plate of a planographic printing plate on which a surface regulating liquid is coated is heated by a burning processor (e.g., burning processor: BP-1300; commercially available from Fuji Photo Film Co., Ltd.) and the like. In this case, the heating temperature and time period thereof is, although it depends upon kinds of component forming an image, preferably in the range of 180–300° C. for 1–20 minutes.

The burning-processed planographic printing plate can be appropriately provided with the conventionally performed treatments such as a washing using water, a gum-drawing and the like according to necessity. However, in the case where a surface regulating liquid containing water soluble polymer compounds and the like has been used, the so-called desensitized fatty treatments such as a gum-drawing and the like are capable of being omitted.

The planographic printing plate obtained by such treatments is incorporated in an offset printing machine or the like, and used for printing a number of sheets.

EXAMPLES

Hereinafter, although the present invention will be described further in detail by examples, however, the present invention is not limited by these.

[Preparation of Supporting Body]

After aluminum plate having a 0.30 mm thickness (material quality 1050) was degreased with trichloroethylene washing, its surface was grained using an aqueous suspension of 400 mesh pumice power by a nylon brush, well rinsed with water.

After aluminum plate was etched by immersing in a 25% sodium hydroxide aqueous solution at 45° C. for 9 seconds and the plate was etched and rinsed with running water, and further, immersed in a 2% $HNO_3$ aqueous solution for 20 seconds and then rinsed with water. At this time, the amount of surface etching of graining was about 3 $g/m^2$.

Subsequently, 7% sulfuric acid aqueous solution was used for an electrolyte solution. On an aluminum plate DC anode, an electrode oxide coating film of 3 $g/m^2$ was provided, and further rinsed with water, and dried. The following coating liquid for an under coating layer was coated, and dried for 30 seconds in an 80° C. atmosphere. The drying coating amout was 10 $mg/m^2$.

[Coating Liquid for Under Coating Layer]

The following components were mixed and the coating liquid for the under coating layer was prepared.

| | |
|---|---|
| 2-aminoethyl phosphonic acid | 0.5 g |
| methanol | 40 g |
| pure water | 60 g |

[Formation of First Layer]

The following coating liquid for first layer formation [A] or coating liquid [B] was coated by wire bar on the supporting body where the foregoing under coating layer had formed, and dried by a hot wind drying device for 45 seconds at 120° C. Thus, the first layer was formed. The amount of coating after drying was 0.5 $g/m^2$.

(Coating Liquid [A] for the First Layer)

| | |
|---|---|
| Polymer compound | 0.5 g |

Copolymer N-(p-aminosulfonylphenyl) methacrylamide and butyl acrylate (35:65 mole ratio, weight average molecular weight 60,000)

| | |
|---|---|
| Naphthalene sulfonic acid of Victoria Pure Blue | 0.01 g |
| Fluorinated surfactant | 0.01 g |
| (MEGAFAC F-176, made by Dai Nippon Ink Chemical Industry, Co., Ltd.) | |
| Methylethylketone | 10 g |
| γ-butylolactone | 7 g |
| Dimethylsulfoxide | 5 g |
| Methanol | 5 g |
| (Coating liquid [B for the first layer) | |
| Polymer compound | 0.5 g |
| Copolymer N-(p- toluenesulfonyl) methacrylamide and methyl acrylate (40:60 mole ratio, weight average molecular weight 80,000) | |
| Infrared absorbing agent [IR- 6] (the following structure) | 0.01 g |
| Naphthalene sulfonic acid of Victoria Pure Blue | 0.01 g |
| Fluorinated surfactant | 0.01 g |
| (MEGAFAC F-176, made by Dai Nippon Ink Chemical Industry, Co., Ltd.) | |
| Methylethylketone | 10 g |
| γ-butylolactone | 7 g |
| Dimethylsulfoxide | 5 g |
| Methanol | 5 g |

[IR-6]

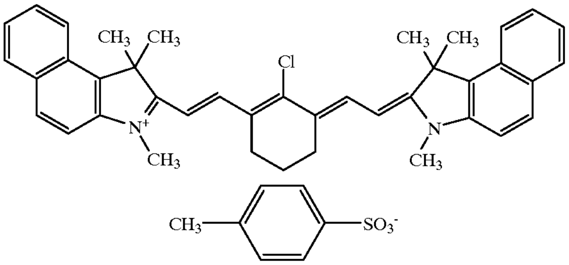

[Formation of Second Layer]

The following coating liquid for second layer formation [C] or coating liquid [D] was coated by wire bar on the supporting body where the foregoing under coating layer had formed, and dried by a hot wind drying device for 45 seconds at 110° C. Thus, the second layer was formed and the planographic printing plate was obtained. The amount of coating of the second layer after drying was 1.5 $g/m^2$.

| (Coating liquid [C] for the second layer) | |
|---|---|
| Infrared absorbing agent [IR- 6] | 0.07 g |
| Radical generating agent [OI- 6] (the following structure) | 0.3 g |
| Dipentaerythritolhexacrylate | 1.0 g |
| Copolymer of acrylmethacrylate and methacrylic acid | 1.0 g |
| (mole ratio 80:20, weight average molecular weight 120,000) | |
| Naphthalene sulfonic acid of Victoria Pure Blue | 0.04 g |
| Fluorinated surfactant | 0.03 g |
| (MEGAFAC F-176, made by Dai Nippon Ink Chemical Industry, Co., Ltd.) | |
| Methylethylketone | 5 g |
| Ethyl acetate | 12 g |
| Methanol | 10 g |

[OI-6]

-continued

[OI-6]

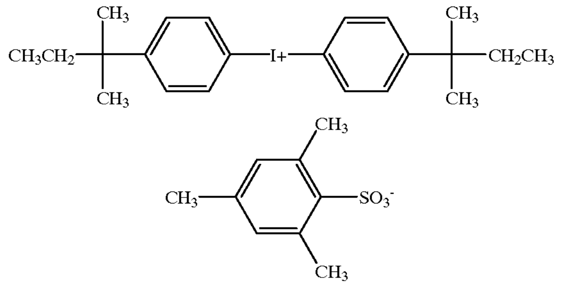

| Coating liquid [D] for the second layer) | |
|---|---|
| Infrared absorbing agent [IR- 6] | 0.06 g |
| Radical generating agent [OI- 6] (the following structure) | 0.3 g |
| Tris (acryloxyethyl) isocyanelate | 0.8 g |
| Copolymer of acrylmethacrylate and methacrylic acid (mole ratio 80:20, weight average molecular weight 120,000) | 1.2 g |
| Naphthalene sulfonic acid of Victoria Pure Blue | 0.04 g |
| Fluorinated surfactant (MEGAFAC F-176, made by Dai Nippon Ink Chemical Industry, Co., Ltd.) | 0.03 g |
| Methylethylketone | 5 g |
| Ethyl acetate | 12 g |
| Methanol | 10 g |

The first layer and second layer were configured as described in the following Table 1, planographic plates [P-1] to [P-3] were obtained, and made Example 1 through Example 3, respectively. Moreover, planographic printing-plate [Q-1] in which the first layer was not formed and only the second layer was made as a recording layer was obtained and made Comparative Example 1.

[Table 1]

TABLE 1

| | Planographic printing plate | Second layer | First layer | Optical density | Sensitivity (mJ/cm$^2$) | Smallest halftone dot | Developing property: Immediately after input | Developing property: After one week |
|---|---|---|---|---|---|---|---|---|
| Example 1 | P-1 | C | A | 0.85 | 80 | 1% | No film residue | No film residue |
| Example 2 | P-2 | D | A | 0.74 | 85 | 1% | No film residue | No film residue |
| Example 3 | P-3 | D | B | 0.86 | 75 | 1% | No film residue | No film residue |
| Comparative Example 1 | Q-1 | C | None | 0.85 | 100 | 2% | No film residue | Film residue present |

[Evaluation of Planographic Printing Plate]

(I. Presence or Absence of Ablation)

The coated surfaces of planographic printing plates P-1, P-2, P-3 and Q-1 were covered with PET film, and exposed under the conditions of: power 9 W, outer peripheral drum rotation count 175 rpm, plate face energy 120 mJ/cm$^2$, resolution 2400 dpi by TRENDSETTER 3244 VFS made by Creo Co., Ltd., mounting water cooling type 40W infrared semiconductor laser. After the exposure, PET film was removed and the coloring state was confirmed by visual inspection. It was confirmed that in each of planographic printing plates, there was no coloring on the PET film nor occurrence of ablation.

(2. Evaluation of Sensitivity)

The planographic printing plates P-1, P-2, P-3 and Q-1 were exposed while changing output power and outer peripheral drum rotation count, and plate face energy by TRENDSETTER 3244 VFS made by Creo Co., Ltd. After the exposure, the developing liquid [G] shown in the following was inputted into an autmatic developing machine STABLON 900N made by Fuji Photo film Co., Ltd., and developed.

Developing Liquid [G]

Aqueous solution containing the following:

| | |
|---|---|
| KOH concentration | 1.5% by weight |
| $SiO_2$ concentration | 1.0% by weight |
| Sodium dibutylnaphthalene sulfonate | 2% by weight |

After the development, a plate face energy that could form a clear solid image was measured, and made sensitivity. High sensitivity was evaluated when the plate face energy was low. The results were listed together in the foregoing Table 1.

As apparent from Table 1, it was confirmed that the planographic printing plates [P-1] through [P-3 ] which are Examples of the present invention were evaluated as smaller in plate face energy necessary for the formation of an image, compared to that of [Q-1] and accordingly, the sensitivity is higher.

(3. Evaluation of Reproducibility of Halftone Dot)

The planographic printing plates P-1, P-2, P-3 and Q-1 were exposed under the conditions of plate face energy 120 mJ/cm$^2$ screen line number 175, lpi by TRENDSETTER 3244 VFS made by Creo Co., Ltd. After the exposure, the development was performed using the same developing liquid and the same automatic developing machine as in the above-described (2. Evaluation of sensitivity). The smallest halftone dot was confirmed using a loupe by visual inspection. The ratio of the smallest halftone dots being small was evaluated as excellent in reproducibility of halftones. The results were listed together in Table 1.

As apparent from Table 1, with the planographic printing plates [P-1] through [P-3] the smallest halftone capable of being reproduced was small, and confirmed that these examples were excellent in the halftone reproducibility compared to that of [Q-1].

(4. Evaluation of Developing Property)

The planographic printing plates P-1, P-2, P-3 and Q-1 were exposed under the conditions of plate face energy 120 mJ/cm$^2$by TRENDSETTER 3244 VFS made by Creo Co., Ltd. After the exposure, using the same developing liquid and the same automatic developing machine as in the above-described (2. Evaluation of sensitivity), the development was performed immediately after the developing liquid was inputted and the presence or absence of film residue at a non-image portion after the develoment was confirmed by visual inspection.

Furthermore, after the developing liquid was inputted in the automatic developing machine, subsequently left it as it was for one week, and after carbon dioxide gas in the air was absorbed by the developing liquid, a planographic printing plate after the exposure similar to the above-described one was developed, and the presence or absence of film residue at the non-image portion was confirmed by visual inspection. The results were listed together in the foregoing Table 1.

As apparent from Table 1, for the planographic printing plates [P-1] through [P-3] which are Examples of the present invention, even in the case where the developing liquid that was left as it was for one week and whose activity was lowered was employed, the development was capable of being carried out without any film residue. [Q-1] of the Comparative Example 1 was developed without problems, but in the case where the developing liquid whose activity was lowered after being left was employed, it was confirmed that occurrence of film residue was seen, and the developing property was inferior.

According to the present invention, a negative type planographic printing plate in which a platemaking is capable of carried out directly from digital data of computers and the like using a solid laser or semiconductor laser irradiating an infrared ray, the sensitivity to the above-described infrared laser is high, ablation of the recording layer during the recording is suppressed, the developing property is quite good, the occurrence of film residue is not seen, and image formation properties such as halftone dot reproducibility and so forth are excellent can be obtained.

What is claimed is:

1. A planographic printing plate, comprising in the following order on a supporting body:

a first layer containing a polymer which is insoluble in water and soluble in an alkaline aqueous solution; and a second layer containing a cross-linking or polymeric compound, which is caused to form a covalent bond by action of one of light and heat, and thereby lowers solubility of said second layer in an alkaline developing liquid.

2. A planographic printing plate according to claim 1, wherein said polymer soluble in an alkaline aqueous solution is a polymer soluble in an alkaline aqueous solution which polymer has an active imide group.

3. A planographic printing plate according to claim 2, wherein said second layer contains an infrared absorbing agent with contents on the order of 1.0 or less of an optical density of said second layer or contents of 10% by weight or less with respect to a total solid contents weight of the polymer compound in said second layer.

4. A planographic printing plate according to claim 2, wherein formation of said covalent bond due to said action of one of light and heat is performed by a cross-linking reaction.

5. A planographic printing plate according to claim 1, wherein said polymer soluble in an alkaline aqueous solution is a polymer soluble in an alkaline aqueous solution which polymer has a carboxylic acid group.

6. A planographic printing plate according to claim 5, wherein said second layer contains an infrared absorbing agent with contents on the order of 1.0 or less of an optical density of said second layer or contents of 10% by weight or less with respect to a total solid contents weight of the polymer compound in said second layer.

7. A planographic printing plate according to claim 5, wherein formation of said covalent bond due to said action of one of light and heat is performed by a cross-linking reaction.

8. A planographic printing plate according to claim 1, wherein said polymer soluble in an alkaline aqueous solution is a polymer soluble in an alkaline aqueous solution which polymer has a sulfonic acid group.

9. A planographic printing plate according to claim 8, wherein said second layer contains an infrared absorbing agent with contents on the order of 1.0 or less of an optical density of said second layer or contents of 10% by weight or less with respect to a total solid contents weight of the polymer compound in said second layer.

10. A planographic printing plate according to claim 1, wherein said polymer soluble in an alkaline aqueous solution is a polymer soluble in an alkaline aqueous solution which polymer has a hydroxyaryl group.

11. A planographic printing plate according claim 10, wherein said second layer contains an infrared absorbing agent with contents on the order of 1.0 or less of an optical density of said second layer or contents of 10% by weight or 1 ss with respect to a total solid contents weight of the polymer compound in said second layer.

12. A planographic printing plate according to claim 1, wherein said polymer soluble in an alkaline aqueous solution is a novolak resin.

13. A planographic printing plate according to claim 1, wherein said second layer contains an infrared absorbing agent with contents on the order of 1.0 or less of an optical density of said second layer or contents of 10% by weight or less with respect to a total solid contents weight of the polymer compound in said second layer.

14. A planographic printing plate according to claim 1, wherein formation of said covalent bond due to said action of one of light and heat is performed by a cross-linking reaction.

15. A planographic printing plate according to claim 1, wherein said polymer, which is insoluble in water and soluble in an alkaline aqueous solution, contains an acidic group in at least one of a main chain and a side chain.

16. A planographic printing plate according to claim 1, wherein said first layer is a thermal insulating layer.

17. A planographic printing plate according to claim 16, wherein said thermal insulating layer prevents heat generated by exposure from being diffused into the supporting body wherein the heat is used for a covalent bond formation reaction.

18. A planographic printing plate according to claim 1, wherein said second layer is a protective layer for said first layer.

19. A planographic printing plate, comprising in the following order on a supporting body:

a first layer containing a polymer which is insoluble in water and soluble in an alkaline aqueous solution and which has a phenol group; and a second layer containing a cross-linking or polymeric compound, which is caused to form a covalent bond by action of one of light and heat, and thereby lowers solubility of said second layer in an alkaline developing liquid.

20. A planographic printing plate according to claim 19, wherein said second layer contains an infrared absorbing agent with contents on the order of 1.0 or less of an optical density of said second layer or contents of 10% by weight or less with respect to a total solid contents weight of the polymer compound in said second layer.

21. A planographic printing plate according to claim 19, wherein formation of said covalent bond due to said action of one of light and heat is performed by a cross-linking reaction.

22. A planographic printing plate according to claim 19, wherein said first layer is a thermal insulating layer.

23. A planographic printing plate according to claim 22, wherein said thermal insulating layer prevents heat generated by exposure from being diffused into the supporting body wherein the heat is used for a covalent bond formation reaction.

24. A planographic printing plate according to claim 19, wherein said second layer is a protective layer for said first layer.

25. A planographic printing plate, comprising in the following order on a supporting body:

a first layer containing a polymer which is insoluble in water and soluble in an alkaline aqueous solution and which has a sulfonamide group; and a second layer containing a cross-linking or polymeric compound, which caused to form a covalent bond by action of one of light and heat, and thereby lowers solubility of said second layer in an alkaline developing liquid.

26. A planographic printing plate according to claim 25, wherein said second layer contains an infrared absorbing agent with contents on the order of 1.0 or less of an optical density of said second layer or contents of 10% by weight or less with respect to a total solid contents weight of the polymer compound in said second layer.

27. A planographic printing plate according to claim 25, wherein formation of said covalent bond due to said action of one of light and heat is performed by a cross-linking reaction.

28. A planographic printing plate according to claim 25, wherein said first layer is a thermal insulating layer.

29. A planographic printing plate according to claim 28, wherein said thermal insulating layer prevents heat generated by exposure from being diffused into the supporting body wherein the heat is used for a covalent bond formation reaction.

30. A planographic printing plate according to claim 25, wherein said second layer is a protective layer for said first layer.

31. A planographic printing plate, comprising in the following order on a supporting body:

an intermediate layer containing a polymer which is insoluble in water and soluble in an alkaline aqueous solution; and an image forming layer containing a cross-linking or polymeric compound, which is caused to form a covalent bond by action of one of light and heat, and therein lowers solubility of said second layer in an alkaline developing liquid.

32. A planographic printing plate according to claim 31, wherein said intermediate layer is a thermal insulating layer.

33. A planographic printing plate according to claim 32, wherein said thermal insulating layer prevents heat generated by exposure from being diffused into the supporting body wherein the heat is used for a covalent bond formation reaction.

34. A planographic printing plate according to claim 31, wherein said image-forming layer is a protective layer for said intermediate layer.

35. A planographic printing plate, comprising in the following order on a supporting body:

an intermediate layer containing a polymer which is insoluble in water and soluble in an alkaline aqueous solution and which has a phenol group; and an image forming layer containing a cross-linking or polymeric compound, which is caused to form a covalent bond by action of one of light and heat, and therein lowers solubility of said second layer in an alkaline developing liquid.

36. A planographic printing plate according to claim 35, wherein said intermediate layer is a thermal insulating layer.

37. A planographic printing plate according to claim 36, wherein said thermal insulating layer prevents heat generated by exposure from being diffused into the supporting body wherein the heat is used for a covalent bond formation reaction.

38. A planographic printing plate according to claim 35, wherein said image-forming layer is a protective layer for said intermediate layer.

39. A planographic printing plate, comprising in the order on a supporting body:

an intermediate layer containing a polymer which is insoluble in water and soluble in an alkaline aqueous solution and which has a sulfonamide group; and an image forming layer containing a cross-linking or polymeric compound, which is caused to form a covalent bond by action of one of light and heat, and therein lowers solubility of said second layer in an alkaline developing liquid.

40. A planographic printing plate according to claim 39, wherein said intermediate layer is a thermal insulating layer.

41. A planographic printing plate according to claim 40, wherein said thermal insulating layer prevents heat generated by exposure from being diffused into the supporting body wherein the heat is used for a covalent bond formation reaction.

42. A planographic printing plate according to claim 39, wherein said image-forming layer is a protective layer for said intermediate layer.

* * * * *